(12) United States Patent
Qiao et al.

(10) Patent No.: US 11,877,441 B2
(45) Date of Patent: Jan. 16, 2024

(54) MEMORY AND FABRICATING METHOD THEREOF

(71) Applicant: CHANGXIN MEMORY TECHNOLOGIES, INC., Hefei (CN)

(72) Inventors: Mengzhu Qiao, Hefei (CN); Tao Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 142 days.

(21) Appl. No.: 17/460,988

(22) Filed: Aug. 30, 2021

(65) Prior Publication Data
US 2022/0285363 A1 Sep. 8, 2022

Related U.S. Application Data

(63) Continuation of application No. PCT/CN2021/101283, filed on Jun. 21, 2021.

(30) Foreign Application Priority Data

Mar. 4, 2021 (CN) .......................... 202110240857.0

(51) Int. Cl.
*H01L 27/108* (2006.01)
*H10B 12/00* (2023.01)

(52) U.S. Cl.
CPC ........... *H10B 12/482* (2023.02); *H10B 12/30* (2023.02); *H10B 12/485* (2023.02)

(58) Field of Classification Search
CPC ..... H10B 12/482; H10B 12/30; H10B 12/485
See application file for complete search history.

(56) References Cited

U.S. PATENT DOCUMENTS

| 2011/0156120 A1 | 6/2011 | Kujirai |
| 2011/0215391 A1 | 9/2011 | Takaishi |

(Continued)

FOREIGN PATENT DOCUMENTS

| CN | 1248065 A | 3/2000 |
| CN | 210640250 U | 5/2020 |

(Continued)

OTHER PUBLICATIONS

International Search Report and Written Opinion for Application PCT/CN2021/103739, dated Sep. 28, 2021, 10 pages.

(Continued)

*Primary Examiner* — Mohammed R Alam
(74) *Attorney, Agent, or Firm* — Ladas & Parry LLP

(57) ABSTRACT

The present application provides a memory and a memory fabricating method. The memory includes a substrate, on which is disposed a separation layer, in which are arranged plural bitlines spaced apart from one another, the plural bitlines are arranged along a first direction, and each bitline is S-shaped. The method of fabricating the memory comprises the following steps: providing a substrate; forming on the substrate plural bitline grooves; forming in each bitline groove a first separation layer; forming bitlines on the first separation layer; forming a second separation layer on the bitlines; removing the substrate between adjacent separation walls, the separation wall including the first separation layer, the bitlines, and the second separation layer; and forming a third separation layer in a space between the adjacent separation walls, the third separation layer, the second separation layer, and the first separation layer together forming a separation layer.

17 Claims, 32 Drawing Sheets

(56) References Cited

U.S. PATENT DOCUMENTS

2015/0263074 A1    9/2015   Takaki
2019/0393222 A1   12/2019   Sharma et al.
2021/0074578 A1*   3/2021   Chou ................ H01L 21/76837

FOREIGN PATENT DOCUMENTS

| CN | 111900164 A | 11/2020 |
|---|---|---|
| CN | 113053897 A | 6/2021 |
| JP | 0774266 A | 3/1995 |

OTHER PUBLICATIONS

International Search for International Application PCT/CN2021/101283 dated Dec. 9, 2021.
Written Opinion for International Application PCT/CN2021/101283 dated Dec. 9, 2021.

* cited by examiner

MEMORY AND FABRICATING METHOD THEREOF

CROSS-REFERENCE TO RELATED APPLICATIONS

This application is a continuation of International Patent Application No. PCT/CN2021/101283 filed on Jun. 21, 2021, which claims the right of priority to Chinese Patent Application No. 202110240857.0 filed on Mar. 4, 2021. The entire contents of the aforementioned patent applications are herein incorporated by reference in their entirety.

TECHNICAL FIELD

The present application relates to the technical field of semiconductors, and more particularly to a memory and its fabricating method.

BACKGROUND

Being a high-speed semiconductor memory that randomly writes and reads data, the dynamic random access memory (DRAM) is widely applied in data storage equipment or devices.

In the currently available DRAMs, it is usual to first form a shallow-groove separation structure to define the active region, embedded wordlines are subsequently etched and formed in the active region, bitline contact plungers are then formed between the embedded wordlines, and the various bitline contact plungers are again connected through bitlines; moreover, the relatively mainstream DRAM in the state of the art is of the 3HPAA×2HPWL structure, where 3HPAA×2HPWL defines the area of a cell bit, and indicates 3 times the half pitch (HP) of the active region (also referred to as "active area", abbreviated as "AA") multiplied by 2 times the half pitch of the wordline (WL). However, a DRAM of such a structure is relatively low in integration level.

SUMMARY

In view of the above problem, embodiments of the present application provide a memory and its fabricating method, so as to enhance the integration level of the memory.

To achieve this objective, embodiments of the present application provide the following technical solutions.

According to the first aspect of the embodiments of the present application, there is provided a memory that comprises a substrate, on which is disposed a separation layer, in which are arranged plural bitlines spaced apart from one another, wherein the plural bitlines are arranged along a first direction, and each bitline is S-shaped.

In the memory exemplified by the present application, plural bitlines are arranged and spaced apart from one another in the separation layer of the substrate, and each bitline is S-shaped and arranged along the first direction; on the substrate of a unit size, with the increase in length of each bitline disposed in the separation layer, the number of bitline contact plungers subsequently disposed to contact the bitline will be increased, the number of active regions subsequently disposed to correspond to the bitline contact plungers on a one-by-one basis will be increased, and the number of capacitors subsequently disposed to correspond to the active regions on a one-by-one basis will also be increased, accordingly, the integration level of the memory will be higher.

According to the second aspect of the embodiments of the present application, there is provided a method of fabricating a memory, which method comprises the following steps: providing a substrate; forming on the substrate plural bitline grooves that are arranged along a first direction and each of which is S-shaped; forming in each bitline groove a first separation layer whose thickness is smaller than depth of the bitline groove; forming bitlines on the first separation layer, wherein total thickness of the first separation layer and the bitlines is smaller than depth of the bitline groove, the plural bitlines are arranged along the first direction, and each bitline is S-shaped; forming a second separation layer on the bitlines, a top surface of the second separation layer being flush with a top surface of the substrate; removing the substrate between adjacent separation walls, and retaining the substrate under a bottom surface of the first separation layer, wherein the separation wall includes the first separation layer, the bitlines, and the second separation layer; and forming a third separation layer in a space between the adjacent separation walls, the third separation layer, the second separation layer, and the first separation layer together forming a separation layer.

In the method of fabricating a memory exemplified by the present application, S-shaped bitline grooves are disposed on the substrate, hence S-shaped bitlines are formed in the S-shaped bitline grooves, thusly, on the substrate of a unit size in the memory so fabricated, with the increase in length of each bitline disposed in the separation layer, the number of bitline contact plungers subsequently disposed to contact the bitline will be increased, the number of active regions subsequently disposed to correspond to the bitline contact plungers on a one-by-one basis will be increased, and the number of capacitors subsequently disposed to correspond to the active regions on a one-by-one basis will also be increased, so the integration level of the memory will be higher.

Besides the technical problem solved by the embodiments of the present application, the technical features that constitute technical solutions and the advantageous effects brought about by the technical features of these technical solutions as mentioned above, other technical problems solvable by the memory and its fabricating method provided by the embodiments of the present application, other technical features included in the technical solutions and advantageous effects brought about by these technical features will be described in greater detail below in the following specific embodiments.

BRIEF DESCRIPTION OF DRAWINGS

In order to more clearly describe the technical solutions of the embodiments of the present application or in the state of the art, accompanying drawings necessary in the description of the current embodiments or the state of the art will be briefly introduced one by one below. Apparently, the accompanying drawings introduced below are merely directed to some embodiments of the present application, and persons ordinarily skilled in the art may acquire other drawings on the basis of these accompanying drawings without spending creative effort in the process.

FIG. 2b is a cross-sectional view cut along line AA in FIG. 2a;

FIG. 2c is a cross-sectional view cut along line BB in FIG. 2a;

FIG. 3b is a cross-sectional view cut along line AA in FIG. 3a;

FIG. 3c is a cross-sectional view cut along line BB in FIG. 3a;

FIG. 4b is a cross-sectional view cut along line AA in FIG. 4a;

FIG. 4c is a cross-sectional view cut along line BB in FIG. 4a;

FIG. 5b is a cross-sectional view cut along line AA in FIG. 5a;

FIG. 5c is a cross-sectional view cut along line BB in FIG. 5a;

FIG. 6b is a cross-sectional view cut along line AA in FIG. 6a;

FIG. 6c is a cross-sectional view cut along line BB in FIG. 6a;

FIG. 7b is a cross-sectional view cut along line AA in FIG. 7a

FIG. 7c is a cross-sectional view cut along line BB in FIG. 7a;

FIG. 8b is a cross-sectional view cut along line AA in FIG. 8a;

FIG. 8c is a cross-sectional view cut along line BB in FIG. 8a;

FIG. 9b is a cross-sectional view cut along line AA in FIG. 9a;

FIG. 9c is a cross-sectional view cut along line BB in FIG. 9a;

FIG. 10b is a cross-sectional view cut along line AA in FIG. 10a;

FIG. 10c is a cross-sectional view cut along line BB in FIG. 10a;

FIG. 11b is a cross-sectional view cut along line AA in FIG. 11a;

FIG. 11c is a cross-sectional view cut along line BB in FIG. 11a;

FIG. 12b is a cross-sectional view cut along line AA in FIG. 12a;

FIG. 12c is a cross-sectional view cut along line BB in FIG. 12a;

FIG. 13b is a cross-sectional view cut along line AA in FIG. 13a;

FIG. 13c is a cross-sectional view cut along line BB in FIG. 13a;

FIG. 14b is a cross-sectional view cut along line AA in FIG. 14a;

FIG. 14c is a cross-sectional view cut along line BB in FIG. 14a;

FIG. 15b is a cross-sectional view cut along line AA in FIG. 15a;

FIG. 15c is a cross-sectional view cut along line BB in FIG. 15a;

FIG. 16b is a cross-sectional view cut along line AA in FIG. 16a;

FIG. 16c is a cross-sectional view cut along line BB in FIG. 16a;

FIG. 17b is a cross-sectional view cut along line AA in FIG. 17a;

FIG. 17c is a cross-sectional view cut along line BB in FIG. 17a;

FIG. 18b is a cross-sectional view cut along line AA in FIG. 18a;

FIG. 18c is a cross-sectional view cut along line BB in FIG. 18a;

FIG. 19b is a cross-sectional view cut along line AA in FIG. 19a;

FIG. 19c is a cross-sectional view cut along line BB in FIG. 19a;

FIG. 20b is a cross-sectional view cut along line AA in FIG. 20a;

FIG. 20c is a cross-sectional view cut along line BB in FIG. 20a;

FIG. 21b is a cross-sectional view cut along line AA in FIG. 21a; and

FIG. 21c is a cross-sectional view cut along line BB in FIG. 21a.

REFERENCE NUMERALS

Figure 1:
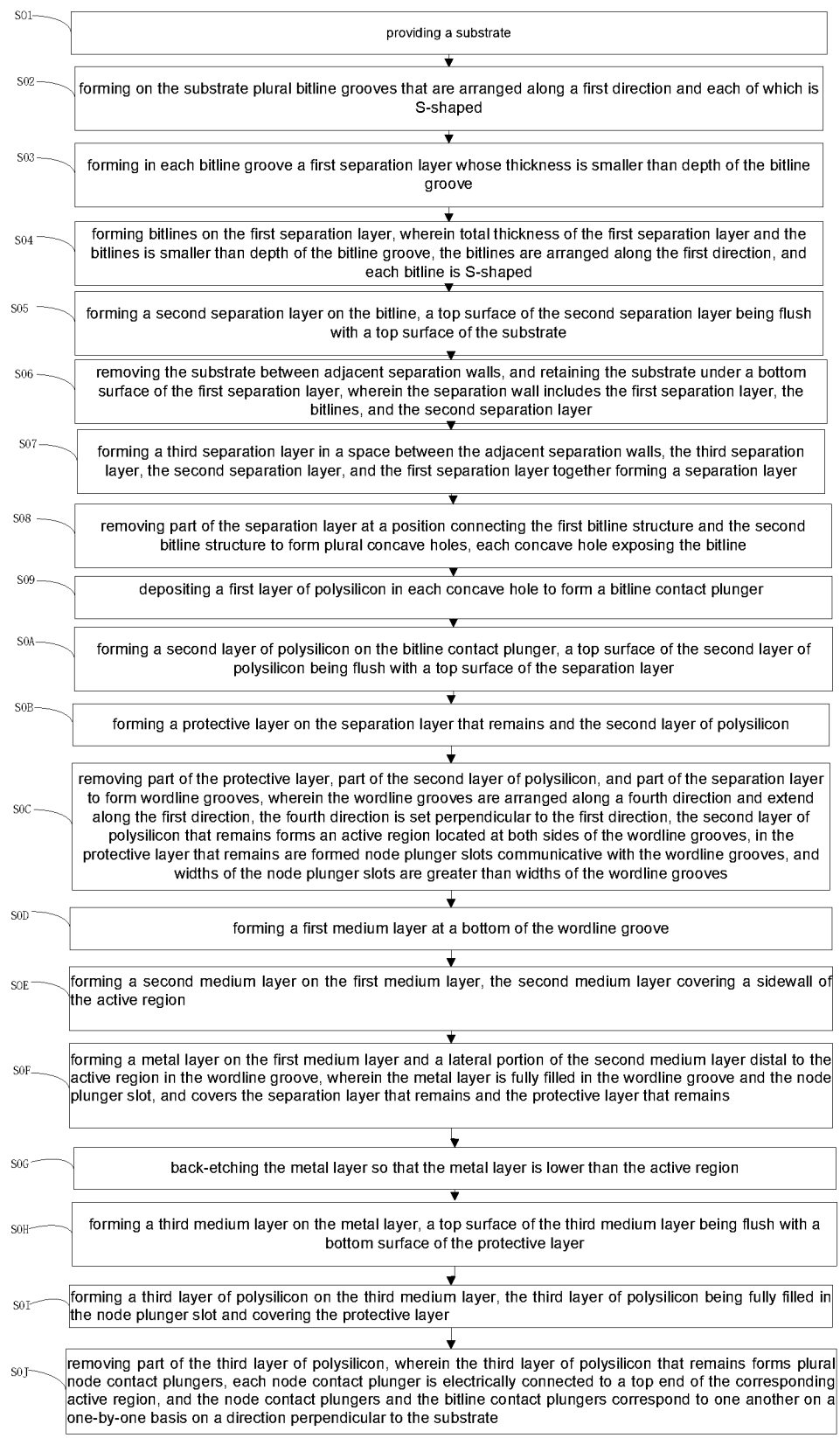
FIG. 1 is a flowchart illustrating the method of fabricating a memory according to an embodiment of the present application.

100: substrate;
101: bitline groove;
200: first separation layer;
201: first layer of silicon dioxide;
300: bitline;
301: tungsten layer;
302: first bitline structure;
303: second bitline structure;
400: second separation layer;
401: second layer of silicon dioxide;
500: separation wall;
600: third separation layer;
700: separation layer;
701: concave hole;
800: bitline contact plunger;
801: first layer of polysilicon;
900: second layer of polysilicon;
901: wordline groove;
902: active region;
A00: protective layer;
A01: node plunger slot;
B00: first medium layer;
C00: second medium layer;
D00: metal layer;
E00: third medium layer;
F00: third layer of polysilicon.

DESCRIPTION OF EMBODIMENTS

In the relevant art of dynamic random access memories (DRAMs), it is usual to first form a shallow-groove separation structure to define the active region, embedded wordlines are subsequently etched and formed in the active region, bitline contact plungers are then formed between the embedded wordlines, and the various bitline contact plungers are again connected through bitlines; moreover, the relatively mainstream DRAM in the state of the art is of the 3HPAA×2HPWL structure, where 3HPAA×2HPWL defines the area of a cell bit, and indicates 3 times the half pitch of the active region multiplied by 2 times the half pitch of the wordline. However, a DRAM of such a structure is low in integration level, as on the substrate of a unit size, the length of each bitline is short, the number of bitline contact plungers corresponding to each bitline is few, the number of active regions subsequently correspondingly disposed is relatively few, and the number of capacitors subsequently correspondingly disposed is relatively few.

In view of the above, an embodiment of the present application provides a method of fabricating a memory, whereby S-shaped bitlines are formed on the substrate, so that with increase in length of each bitline on the substrate of a unit size, the number of bitline contact plungers subsequently disposed to contact the bitlines will be increased, the number of active regions subsequently disposed to correspond to the bitline contact plungers on a one-by-one basis will be increased, and the number of capacitors subsequently disposed to correspond to the active regions on a one-by-one basis will also be increased, so the integration level of the memory is enhanced.

To make more apparent and comprehensible the aforementioned objectives, features and advantages of the embodiments of the present application, technical solutions in the embodiments of the present application will be clearly and comprehensively described below with reference to the accompanying drawings. Apparently, the embodiments to be described are only partial, rather than entire, embodiments of the present application. All other embodiments obtainable by persons ordinarily skilled in the art on the basis of the embodiments in the present application without spending creative effort in the process shall all fall within the protection scope of the present application.

As shown in FIG. 1, an embodiment of the present application provides a method of fabricating a memory, which method comprises the following steps.

S01: providing a substrate. The substrate can be of such a semiconductor substrate material well known to persons skilled in the art as silicon, germanium, etc.

Figure 2A:
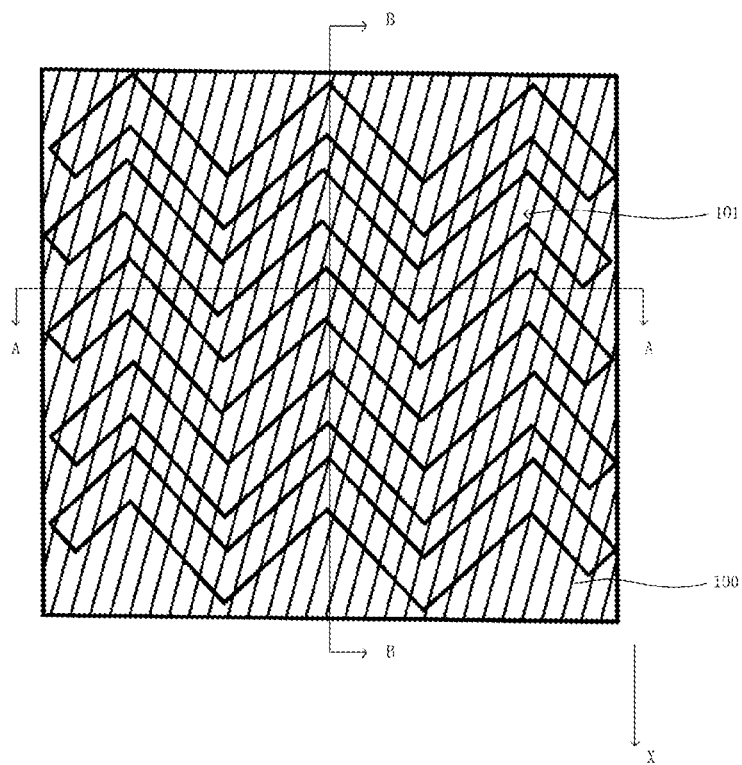
FIG. 2a is a diagram schematically illustrating the structure of a substrate with bitline grooves being disposed thereon in an embodiment of the present application.
Figure 2B:
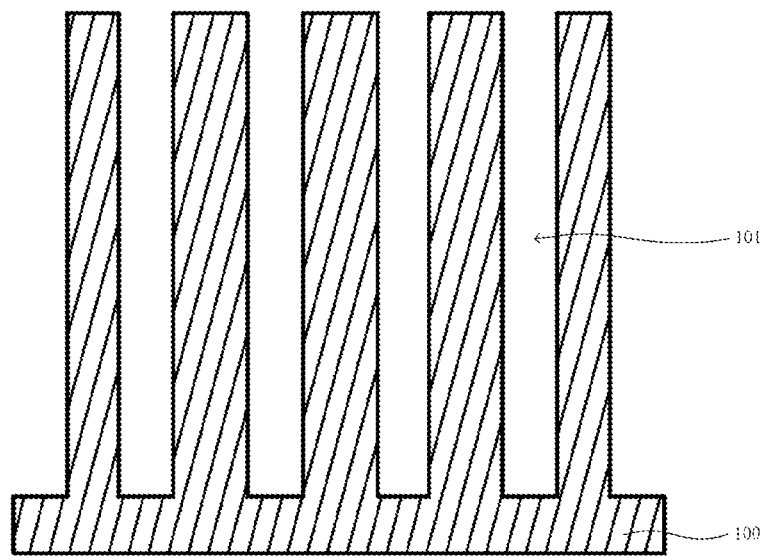
Figure 2C:
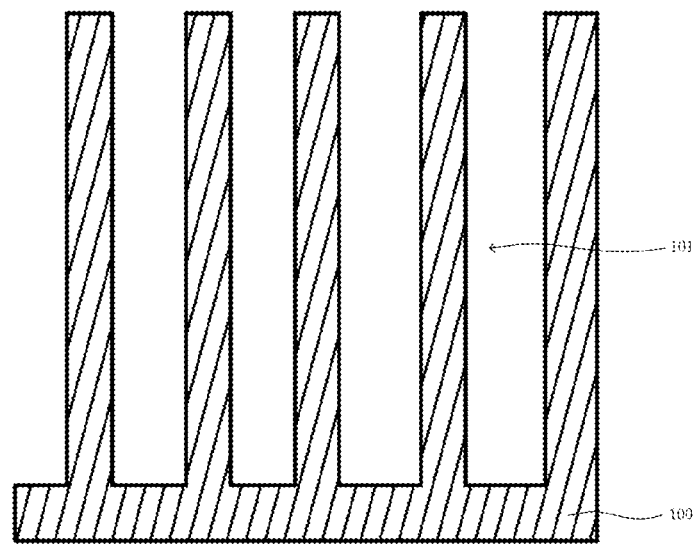

S02: forming on the substrate plural bitline grooves that are spaced apart from one another and arranged along a first direction, and each of which is S-shaped. The first direction is for example direction X shown in FIG. 2a, and the structure formed by this step is as shown in FIGS. 2a, 2b and 2c, in which structure plural bitline grooves 101 are spaced apart and arranged along the first direction, and each bitline groove 101 is S-shaped.

Figure 3A:
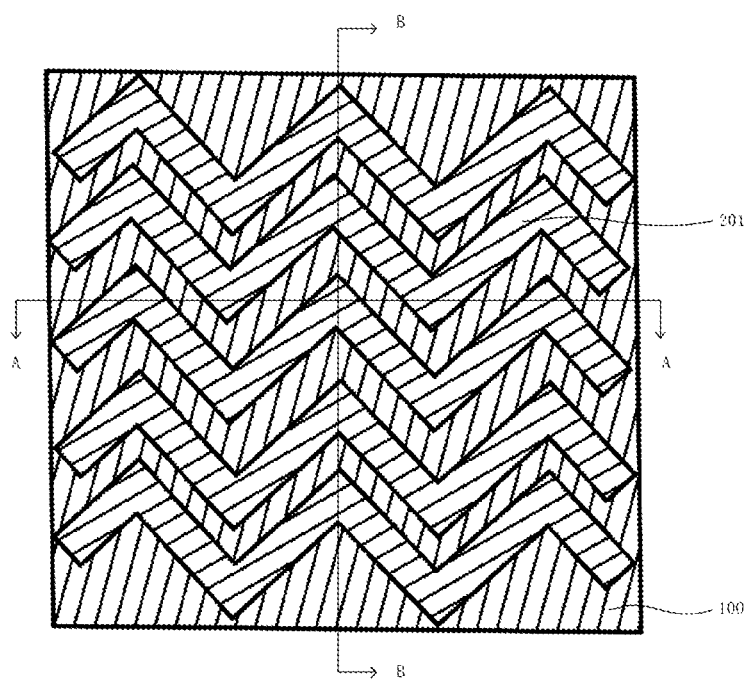
FIG. 3a is a diagram schematically illustrating the structure of bitline grooves with first layers of silicon dioxide being disposed therein in an embodiment of the present application.
Figure 3B:
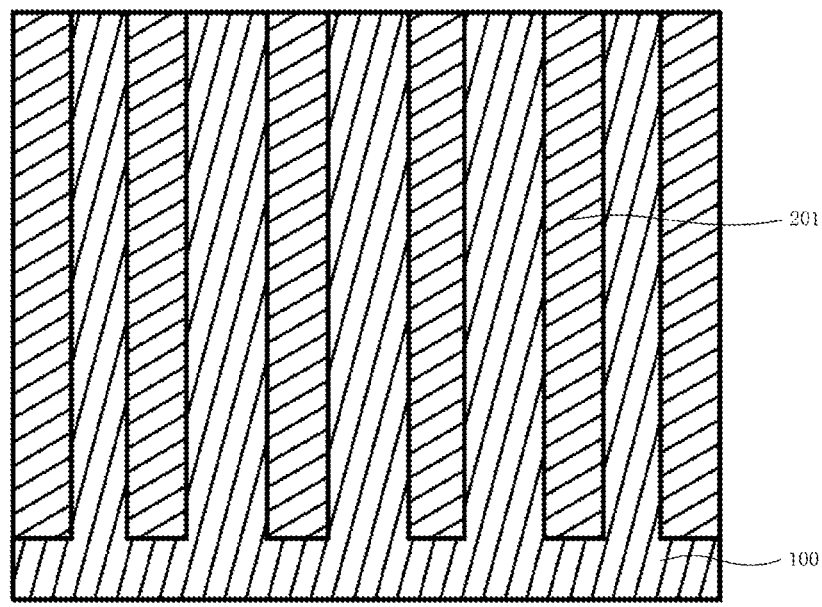
Figure 3C:
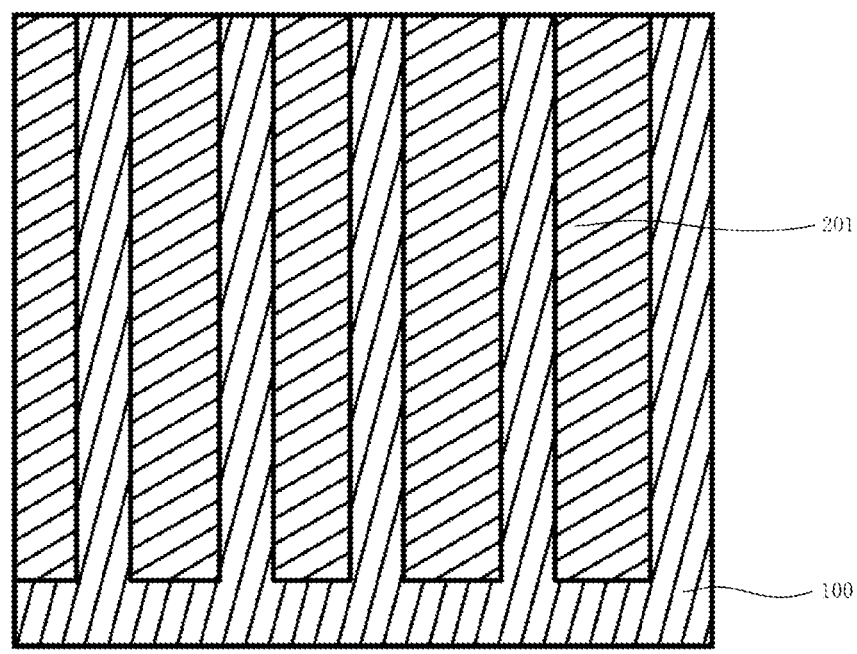
Figure 4A:
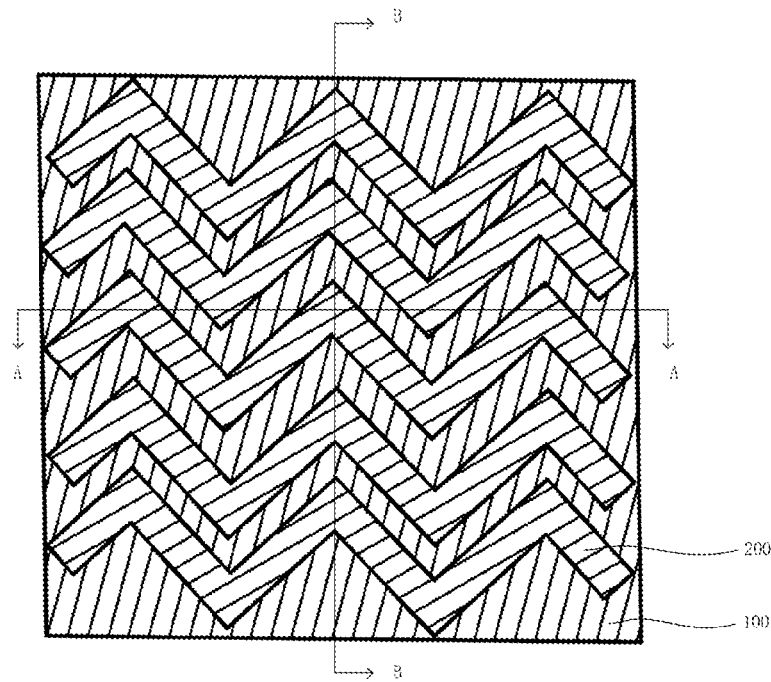
FIG. 4a is a diagram schematically illustrating the structure of bitline grooves with first separation layers being formed therein in an embodiment of the present application.
Figure 4B:
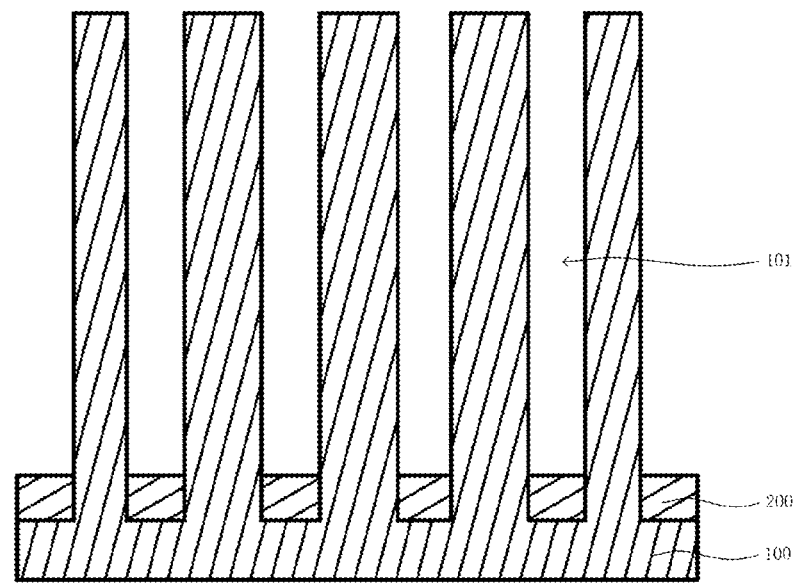
Figure 4C:
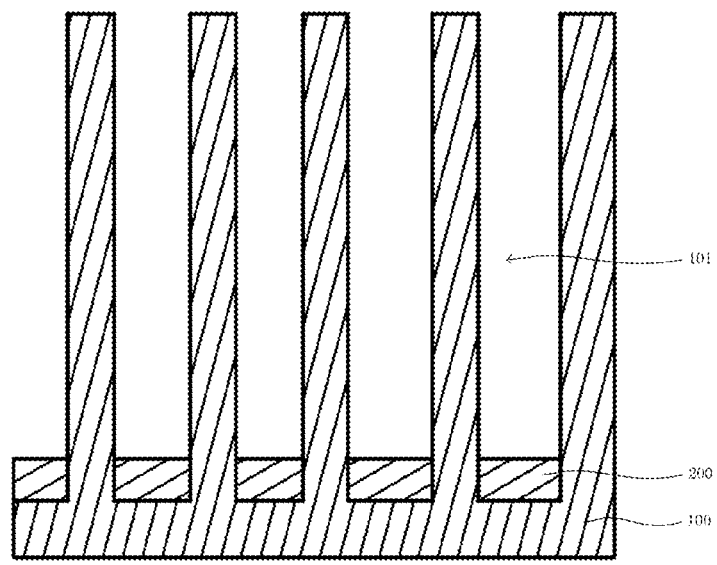

S03: forming in each bitline groove 101 a first separation layer whose thickness is smaller than depth of the bitline groove 101. The material of the first separation layer can be for example silicon dioxide, and the first separation layer can be formed in the bitline groove 101 by the process of deposition. In the process of forming the first separation layer, a first layer of silicon dioxide is firstly formed on the substrate 100 with a bitline groove 101 already disposed thereon, the first layer of silicon dioxide is fully filled in the bitline groove 101 and covers the remaining substrate 100, the part of the first layer of silicon dioxide higher than the top surface of the substrate 100 is removed, and the structure formed by this step is as shown in FIGS. 3a, 3b and 3c, in which structure the first layer of silicon dioxide 201 is located in the bitline groove 101, and the first layer of silicon dioxide 201 is flush with the top surface of the substrate 100; secondly, the first layer of silicon dioxide 201 is further partially removed, only remains the part of the first layer of silicon dioxide 201 in the bitline groove 101, and the thickness of the first layer of silicon dioxide 201 that remains in the bitline groove 101 is smaller than the depth of the bitline groove 101, so as to form the first separation layer; the structure formed by this step is as shown in FIGS. 4a, 4b and 4c, in which structure the first separation layer 200 is located in the bitline groove 101, the thickness of the first separation layer 200 is smaller than the depth of the bitline groove 101, and the top surface of the first separation layer 200 is lower than the groove notch of the bitline groove 101.

Figure 5A:
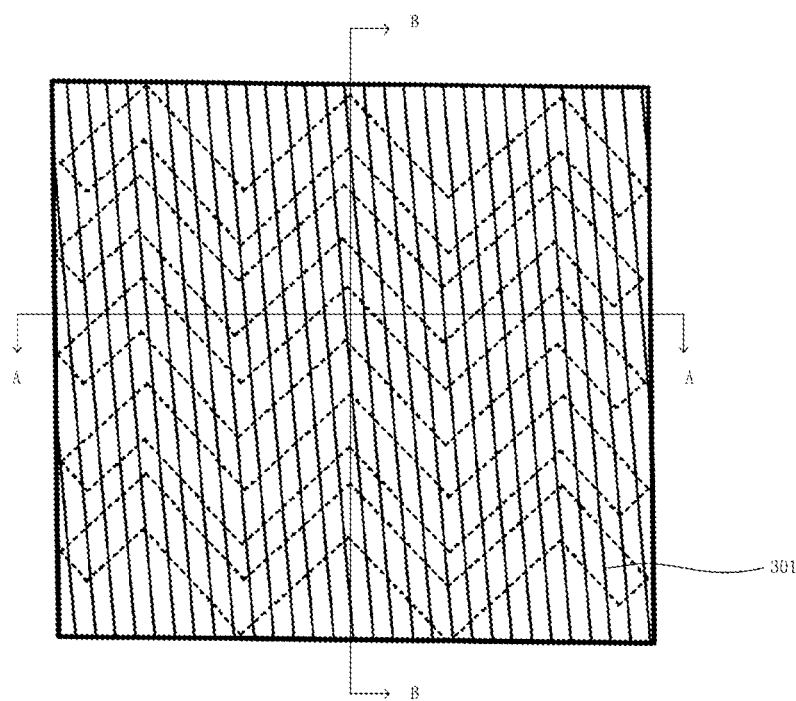
FIG. 5a is a diagram schematically illustrating the structure of bitline grooves with tungsten layers being disposed therein in an embodiment of the present application.
Figure 5B:
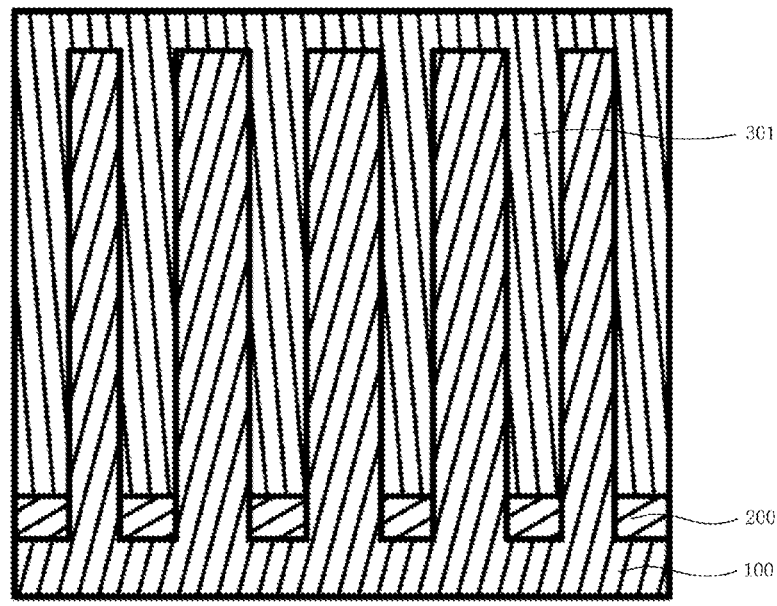
Figure 5C:
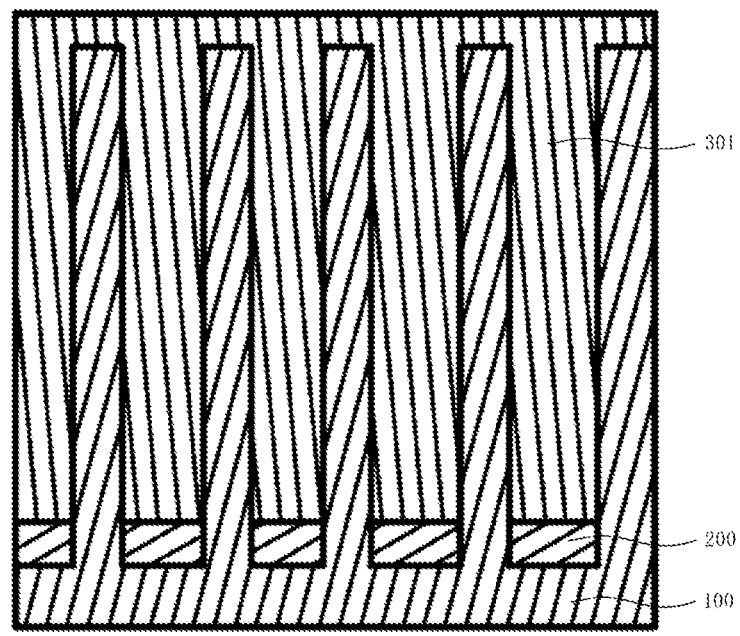

S04: forming bitlines on the first separation layer 200, wherein total thickness of the first separation layer 200 and the bitlines is smaller than groove depth of the bitline groove 101, the plural bitlines are arranged along the first direction, and each bitline is S-shaped. The material of the bitline can be for example tungsten, and the bitline can be formed on the first separation layer 200 in the bitline groove 101 by the process of deposition. In the process of forming the bitline, a layer of tungsten layer is firstly formed on the substrate 100 with the bitline groove 101 and the first separation layer 200 already disposed thereon, the tungsten layer is fully filled in the bitline groove 101 and covers the remaining substrate 100, and the structure formed by this step is as shown in FIGS. 5a, 5b and 5c, of which FIG. 5a shows positions of the bitline grooves 101 by dotted lines. In the structure formed by this step, the tungsten layer 301 is located in the bitline groove 101, and the tungsten layer 301 further covers the top surface of the remaining substrate 100; secondly, the tungsten layer 301 is partially removed, only remains the tungsten layer 301 in the bitline groove 101, and the thickness of the tungsten layer 301 remaining in the bitline groove 101 is smaller than the depth of the bitline groove 101, so as to form the bitline; the structure formed by this step is as shown in FIGS. 6a, 6b and 6c, in which structure the bitline 300 is located on the first separation layer 200 in the bitline groove 101, the top surface of the bitline 300 is lower than the groove notch of the bitline groove 101, and the thickness of the bitline 300 plus the thickness of the first separation layer 200 are lower than the groove depth of the bitline groove 101.

Figure 6A:
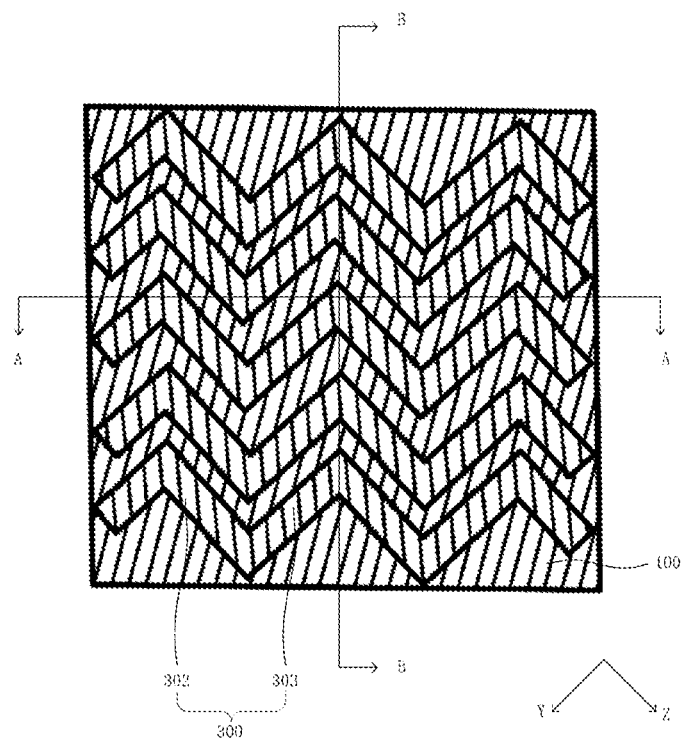
FIG. 6a is a diagram schematically illustrating the structure of bitline grooves with bitlines being formed therein in an embodiment of the present application.
Figure 6B:
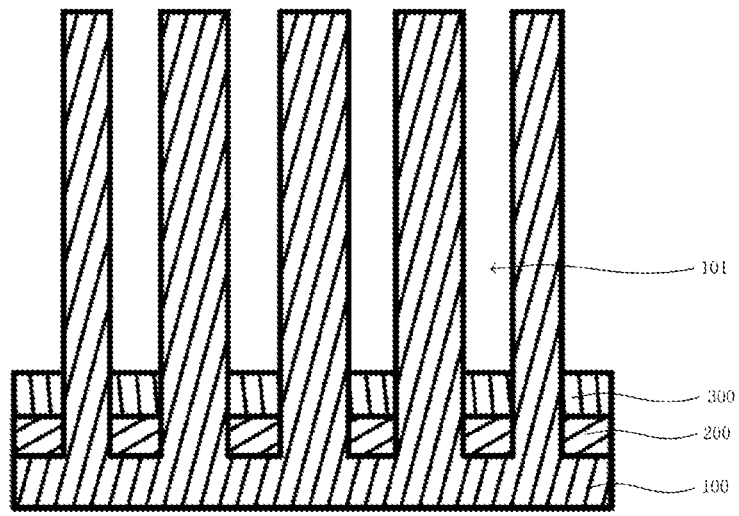
Figure 6C:
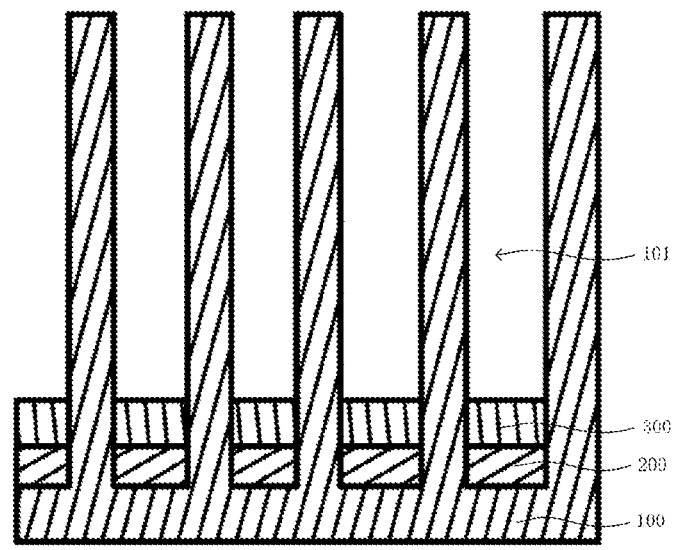

Referring to FIG. 6a, in the step of forming the bitline 300 on the first separation layer 200, each bitline 300 as formed includes plural first bitline structures 302 and plural second bitline structures 303 spaced apart from one another and sequentially connected to one another, the first bitline structures 302 extend along a second direction, the second direction is inclined relative to the first direction, the second bitline structures 303 extend along a third direction, the third direction is inclined relative to the first direction, and the direction of inclination of the third direction relative to the first direction is opposite to the direction of inclination of the second direction relative to the first direction, of which the second direction is for example direction Y shown in FIG. 6a, and the third direction is for example direction Z shown in FIG. 6a.

Figure 7A:
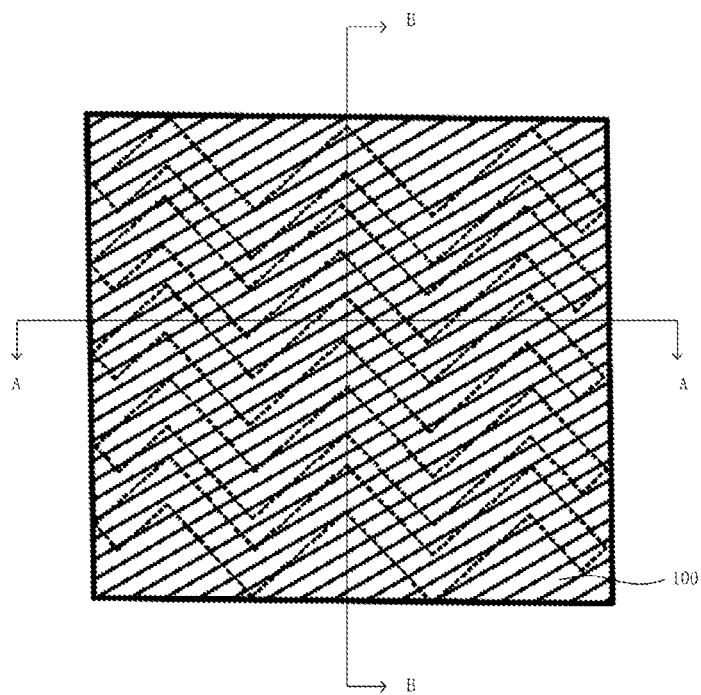
FIG. 7a is a diagram schematically illustrating the structure of bitline grooves with second layers of silicon dioxide being disposed therein in an embodiment of the present application.
Figure 7B:
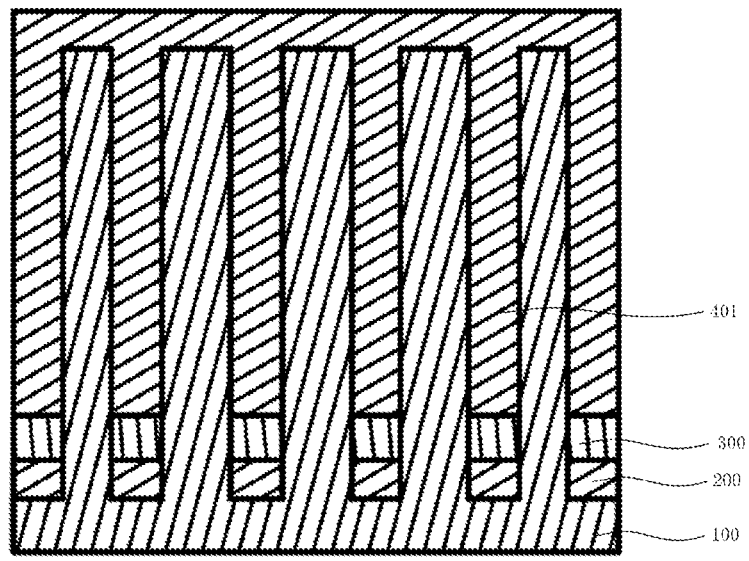
Figure 7C:
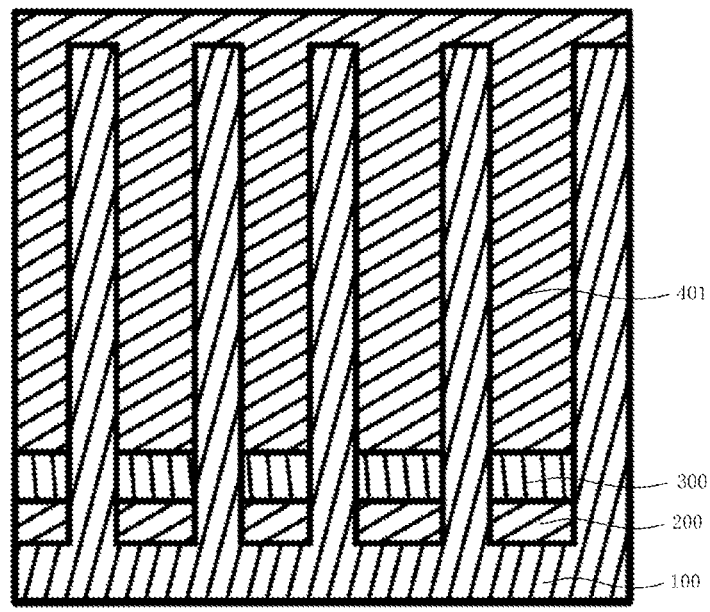
Figure 8A:
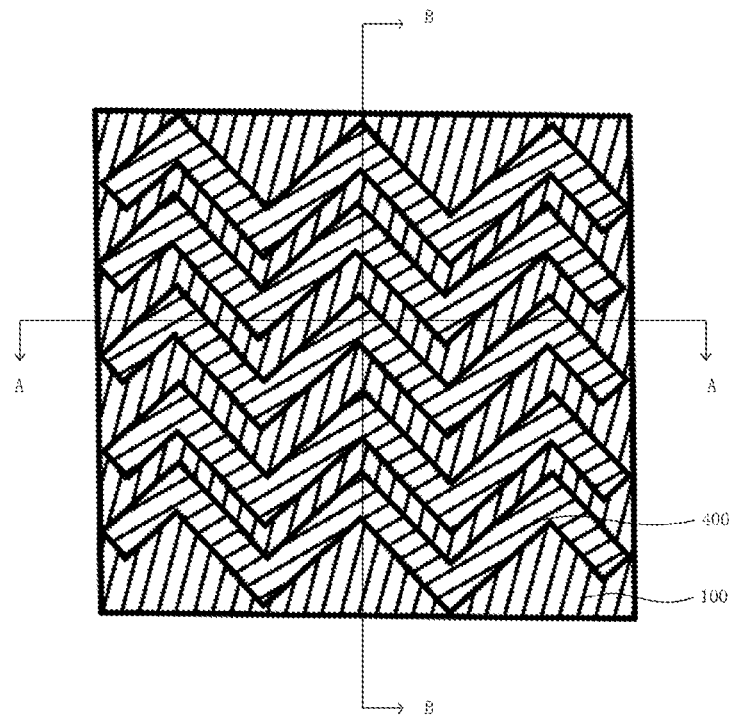
FIG. 8a is a diagram schematically illustrating the structure in which second layers of silicon dioxide are partially removed in an embodiment of the present application.
Figure 8B:
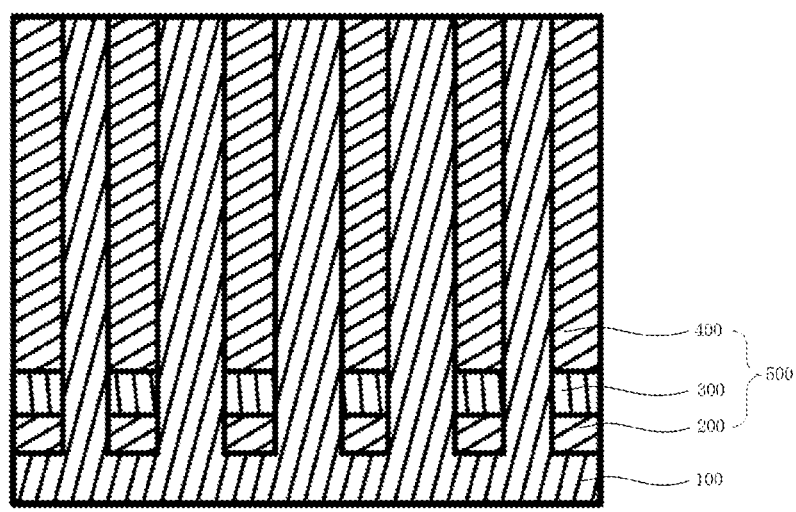
Figure 8C:
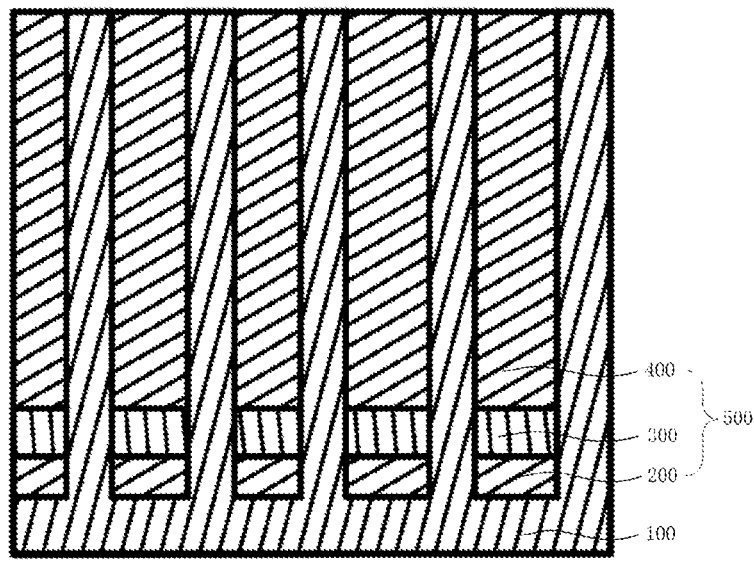

S05: forming a second separation layer on the bitline 300, a top surface of the second separation layer being flush with a top surface of the substrate 100. The material of the second separation layer can be the same as the material of the first separation layer 200, for instance silicon dioxide, and the second separation layer can be formed on the bitline 300 in the bitline groove 101 by the process of deposition. In the process of forming the second separation layer, a second layer of silicon dioxide is firstly formed on the substrate 100 with the bitline 300 already disposed thereon, the second layer of silicon dioxide is fully filled in the bitline groove 101 and covers the remaining substrate 100, and the structure formed by this step is as shown in FIGS. 7a, 7b and 7c, of which FIG. 7a shows the positions of the bitline grooves 101 by dotted lines; in the structure formed by this step, the second layer of silicon dioxide 401 is located in the bitline groove 101, and the second layer of silicon dioxide 401 further covers the top surface of the remaining substrate 100; secondly, the second layer of silicon dioxide 401 is partially removed, only remains the second layer of silicon dioxide 401 in the bitline groove 101, and the top surface of the second layer of silicon dioxide 401 remaining in the bitline groove 101 is flush with the top surface of the substrate 100, so as to form the second separation layer; the structure formed by this step is as shown in FIGS. 8a, 8b and 8c, in which structure the second separation layer 400 is located on the bitline 300 in the bitline groove 101, and the thickness of the second separation layer 400 plus the thickness of the bitline 300 further plus the thickness of the first separation layer 200 are equal to the groove depth of the bitline groove 101.

Figure 9A:
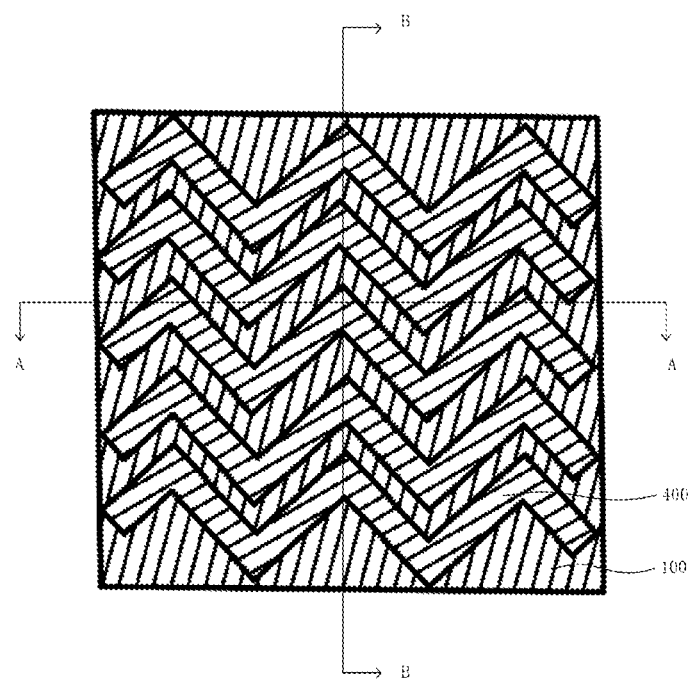
FIG. 9a is a diagram schematically illustrating the structure in which the substrate is partially removed between adjacent separation walls in an embodiment of the present application.
Figure 9B:
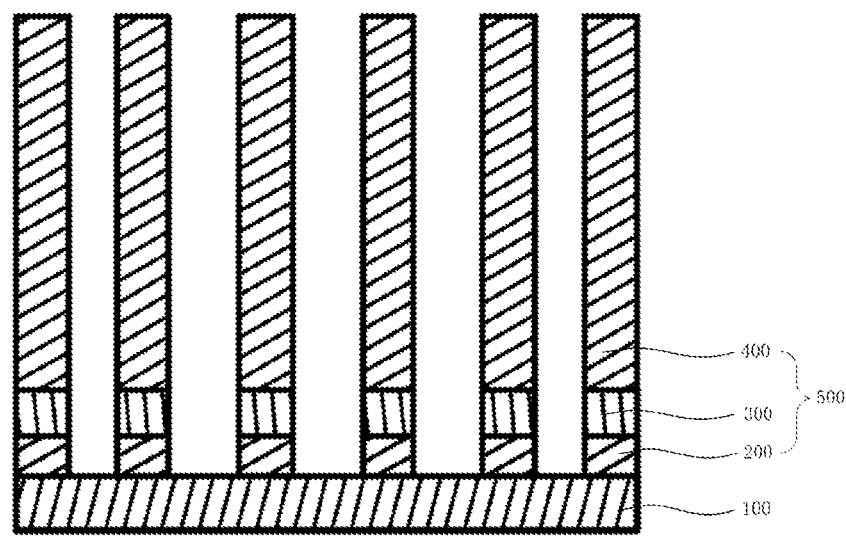
Figure 9C:
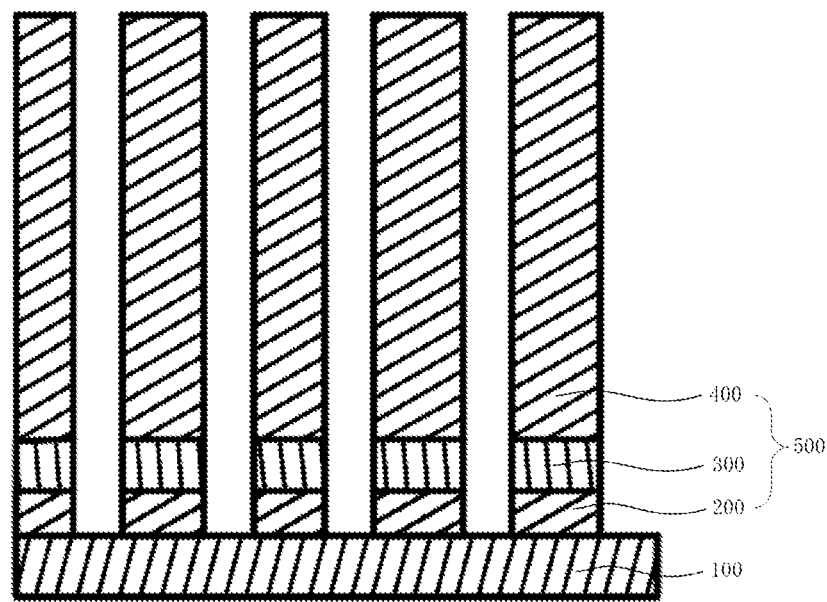

S06: removing the substrate 100 between adjacent separation walls, and retaining the substrate 100 under a bottom surface of the first separation layer 200, wherein the separation wall includes the first separation layer 200, the bitline 300, and the second separation layer 400. The substrate 100 can be removed between adjacent separation walls by the process of etching, and the structure formed by this step is as shown in FIGS. 9a, 9b and 9c, in which structure plural separation walls 500 are disposed to be spaced apart from one another on the top surface of the substrate 100, each separation wall 500 includes a first separation layer 200 disposed on the substrate 100, a bitline 300 disposed on the first separation layer 200, and a second separation layer 400 disposed on the bitline 300; each separation wall 500 is S-shaped, and plural separation walls 500 are arranged along the first direction.

Figure 10A:
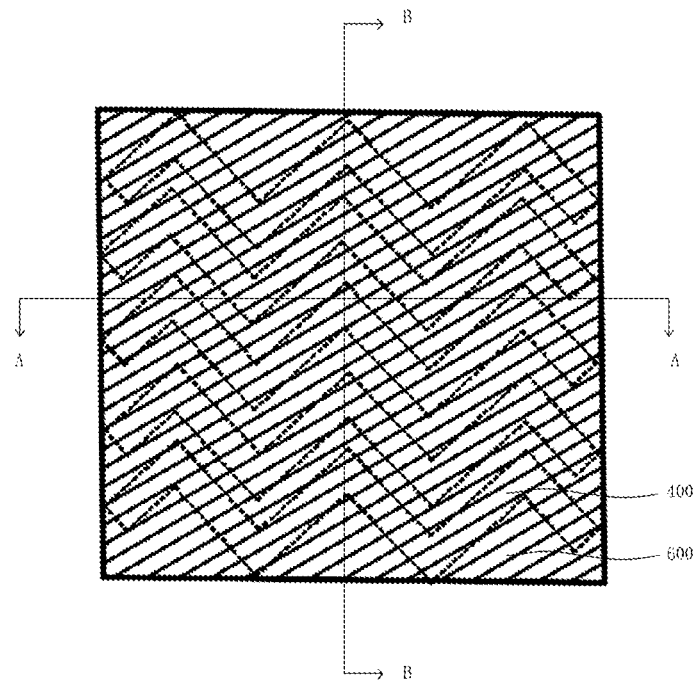
FIG. 10a is a diagram schematically illustrating the structure in which third separation layers are disposed in spaces between separation walls in an embodiment of the present application.
Figure 10B:
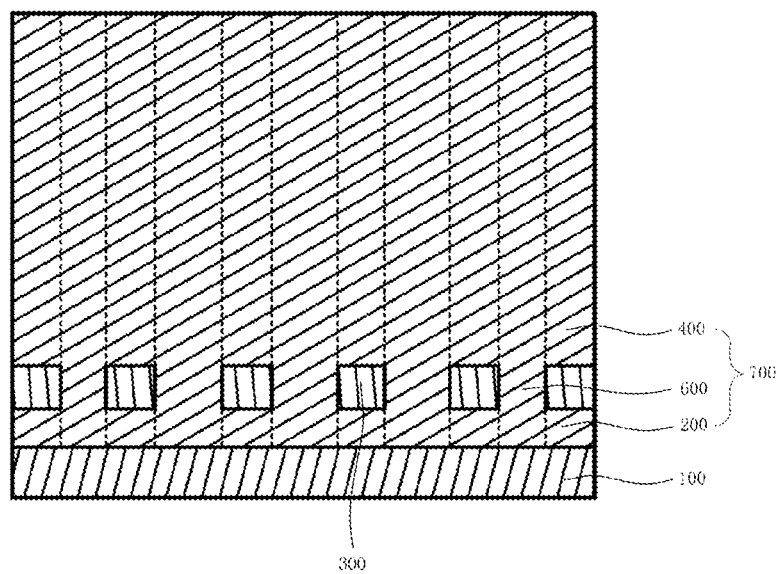
Figure 10C:
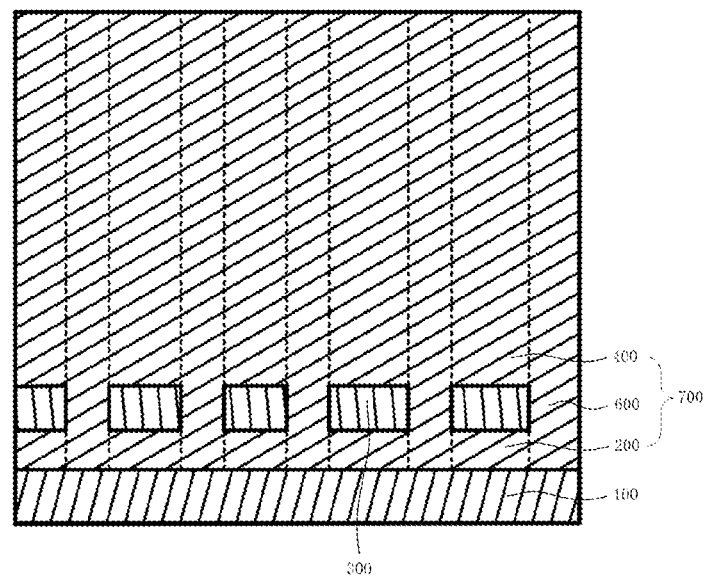

S07: forming a third separation layer in a space between the adjacent separation walls 500, the third separation layer, the second separation layer 400, and the first separation layer 200 together forming a separation layer. The material of the third separation layer can be the same as the material of the first separation layer 200 and the second separation layer 400, for instance silicon dioxide, and the third separation layer can be formed in a space between two adjacent separation walls 500 by the process of deposition. The structure formed by this step is as shown in FIGS. 10a, 10b and 10c, in which structure a separation wall 500 and a third separation layer 600 are disposed and spaced apart on the substrate 100, the separation wall 500 includes a first separation layer 200 disposed on the substrate 100, a bitline 300 disposed on the first separation layer 200, and a second separation layer 400 disposed on the bitline 300; right below the bitline 300 is the first separation layer 200, right above the bitline 300 is the second separation layer 400, the third separation layer 600 is at the two sides of the bitline 300, the bitline 300 is formed in a separation layer 700 formed by the first separation layer 200, the second separation layer 400 and the third separation layer 600, and the separation layer 700 can realize insulation between adjacent bitlines 300; dotted lines in FIG. 10a are used to indicate positions of the bitline grooves 101, and dotted lines in FIGS. 10b and 10c are used to indicate that the first separation layer 200, the second separation layer 400 and the third separation layer 600 are formed in different processing steps.

In the method of fabricating a memory exemplified by the present application, S-shaped bitline grooves 101 are disposed on the substrate 100, hence S-shaped bitlines 300 are formed in the S-shaped bitline grooves 101, thusly, on the substrate 100 of a unit size in the memory so fabricated, with the increase in length of the bitlines 300 disposed in the separation layer 700, the number of bitline contact plungers subsequently disposed to contact the bitlines 300 will be increased, the number of active regions subsequently disposed to correspond to the bitline contact plungers on a one-by-one basis will be increased, and the number of capacitors subsequently disposed to correspond to the active regions on a one-by-one basis will also be increased, so the integration level of the memory will be higher.

The memory fabricated by the method of fabricating a memory according to the embodiment of the present application is of 2HPAA×2HPWL structure, where 2HPAA×2HPWL defines the area of a cell bit, and indicates 2 times the half pitch of the active region multiplied by 2 times the half pitch of the wordline, and the area of a 4F2 storage cell formed by the 2HPAA×2HPWL structure will be reduced to be about two-thirds the area of a 6F2 storage cell formed by the 3HPAA×2HPWL structure — this is equivalent to say that the storage density of the 4F2 storing structure is greater, and that its integration level is higher.

Further referring to FIG. 1, after forming the third separation layer 600, the method further comprises the following steps.

Figure 11A:
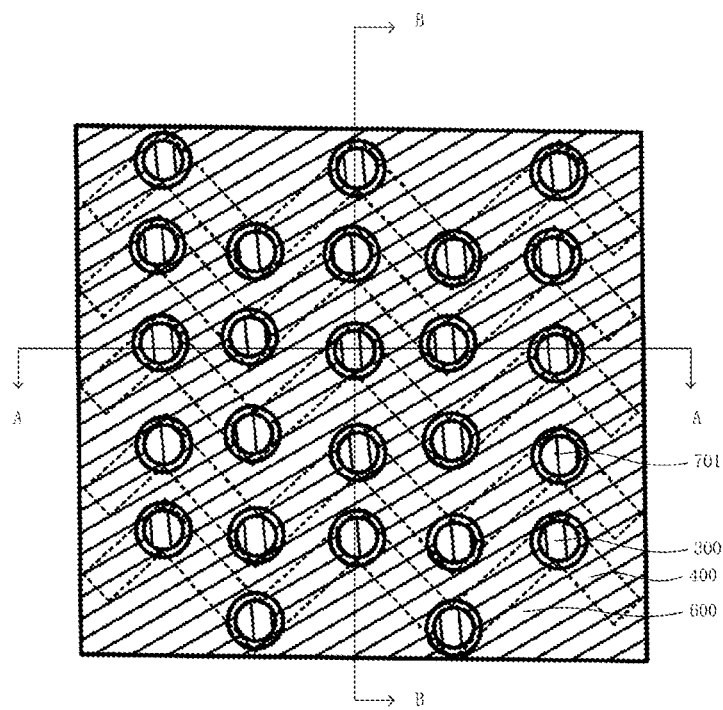
FIG. 11a is a diagram schematically illustrating the structure in which concave holes are disposed on separation layers in an embodiment of the present application.
Figure 11B:
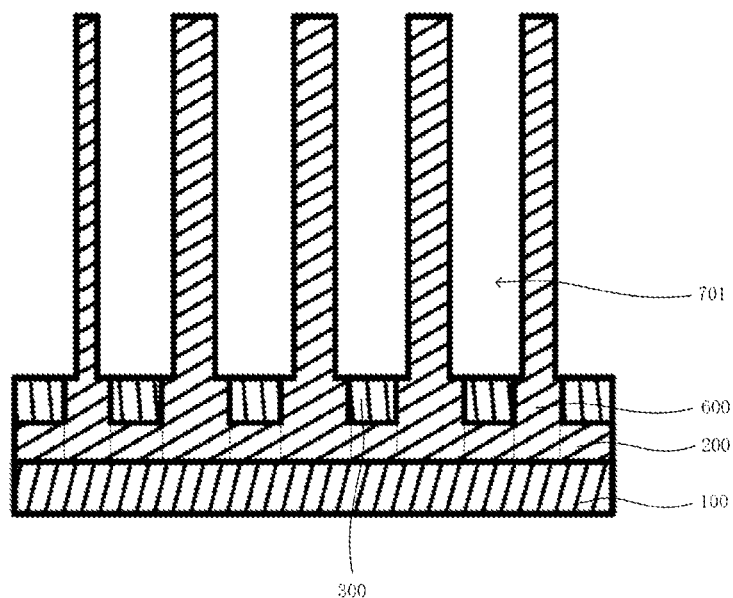
Figure 11C:
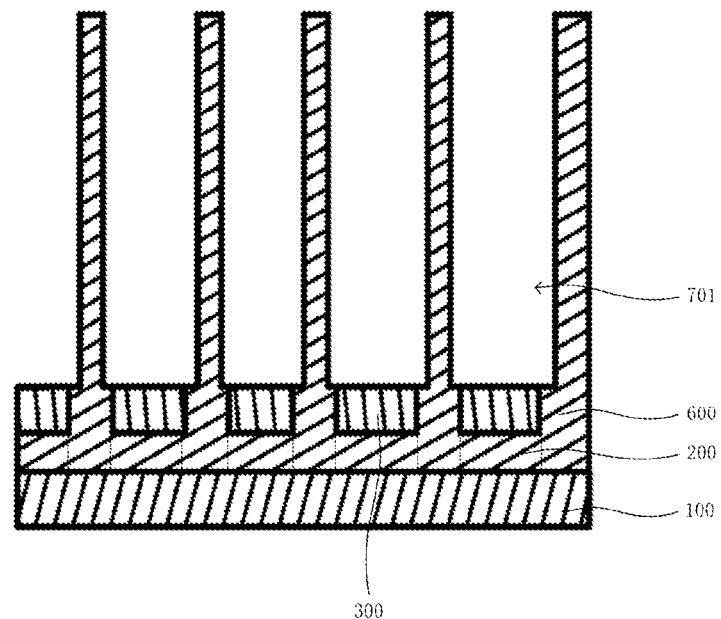

S08: removing part of the separation layer 700 at a position connecting the first bitline structure 302 and the second bitline structure 303 to form plural concave holes, each concave hole exposing the bitline 300. The concave hole can be a round hole, part of the separation layer 700 can be removed by the process of etching at a position connecting the first bitline structure 302 and the second bitline structure 303 to form the concave holes, and the structure formed by this step is as shown in FIGS. 11a, 11b and 11c, in which structure each concave hole 701 is located at a position connecting the first bitline structure 302 and the second bitline structure 303, and each concave hole 701 exposes a bitline 300 corresponding to it; dotted lines in FIG. 11a are used to indicate positions of the bitline grooves 101, and dotted lines in FIGS. 11b and 11c are used to indicate that the first separation layer 200 and the third separation layer 600 are formed in different processing steps.

Figure 14A:
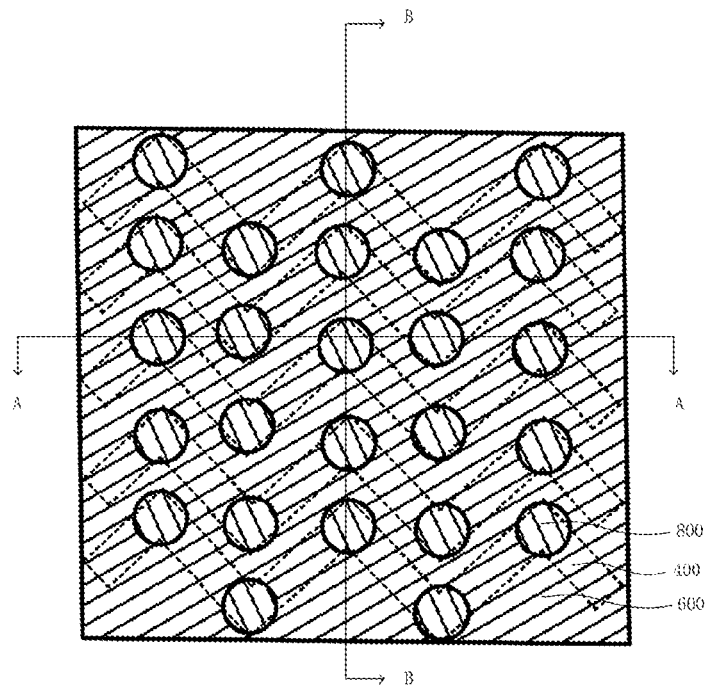
FIG. 14a is a diagram schematically illustrating the structure in which bitline contact plungers are formed in concave holes in an embodiment of the present application.
Figure 14B:
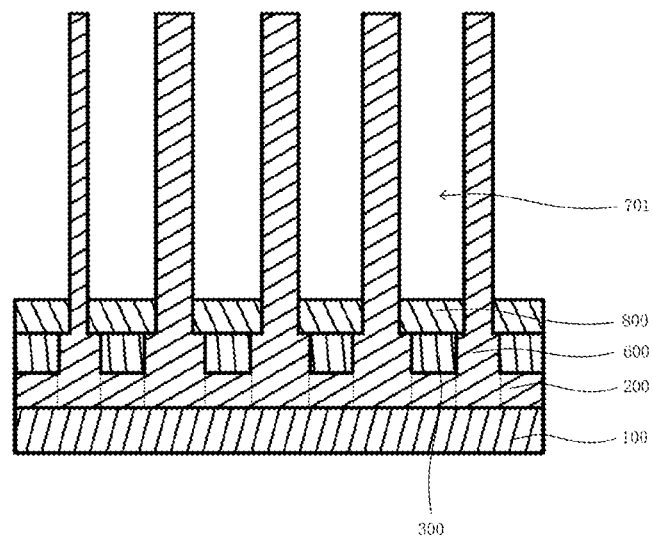
Figure 14C:
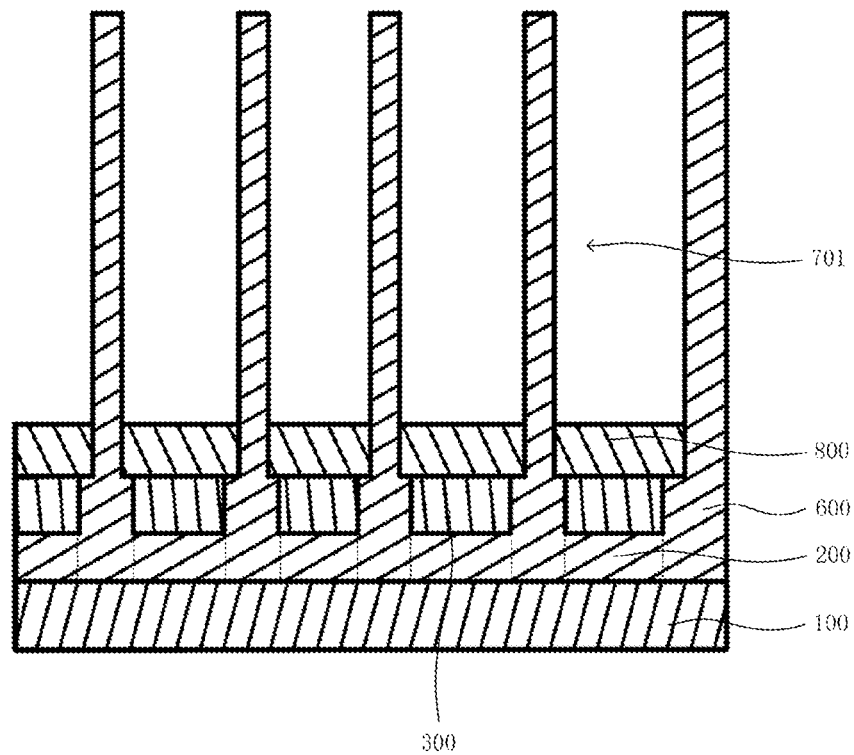

S09: depositing a first layer of polysilicon in each concave hole 701 to form a bitline contact plunger. The first layer of polysilicon can be deposited in each concave hole 701 by chemical vapor deposition (CVD) or atomic layer deposition (ALD), and such ions as phosphorus ions or boron ions that change the electrical properties of the first layer of polysilicon are doped at the same time of depositing the first layer of polysilicon; the structure formed by this step is as shown in FIGS. 14a, 14b and 14c, in which structure the bitline contact plunger 800 is located in the concave hole 701, the top surface of the bitline contact plunger 800 is lower than the top surface of the third separation layer 600 and the top surface of the second separation layer 400, and the thickness of the bitline contact plunger 800 can be 50 nanometers (nm) for instance; dotted lines in FIG. 14a are used to indicate positions of the bitline grooves 101, and dotted lines in FIGS. 14b and 14c are used to indicate that the first separation layer 200 and the third separation layer 600 are formed in different processing steps.

Figure 14D:
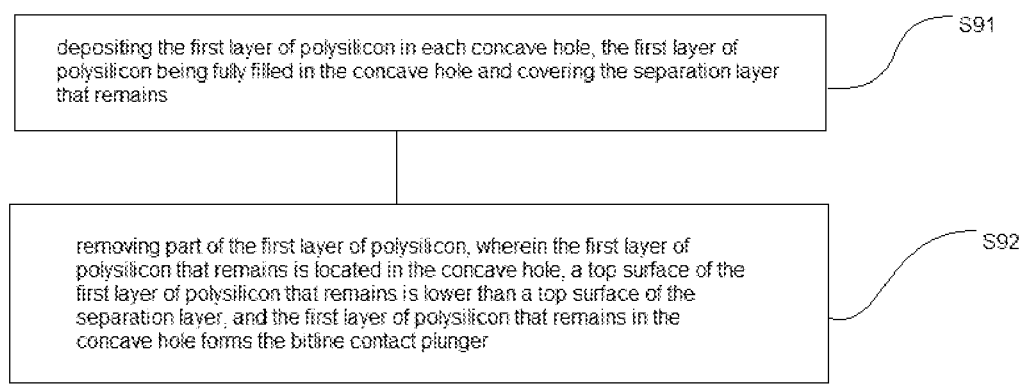
FIG. 14d is a flowchart illustrating the process of forming bitline contact plungers in an embodiment of the present application.

Referring to FIG. 14d, the step of depositing a first layer of polysilicon in each concave hole 701 to form a bitline contact plunger 800 includes the following steps.

Figure 12A:
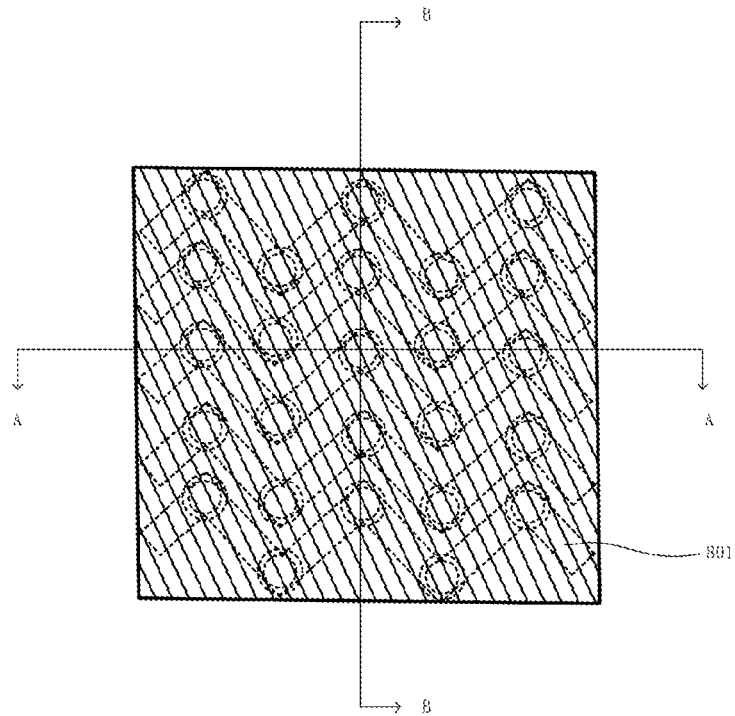
FIG. 12a is a diagram schematically illustrating the structure in which first layers of polysilicon are disposed on concave holes and remaining separation layers in an embodiment of the present application.
Figure 12B:
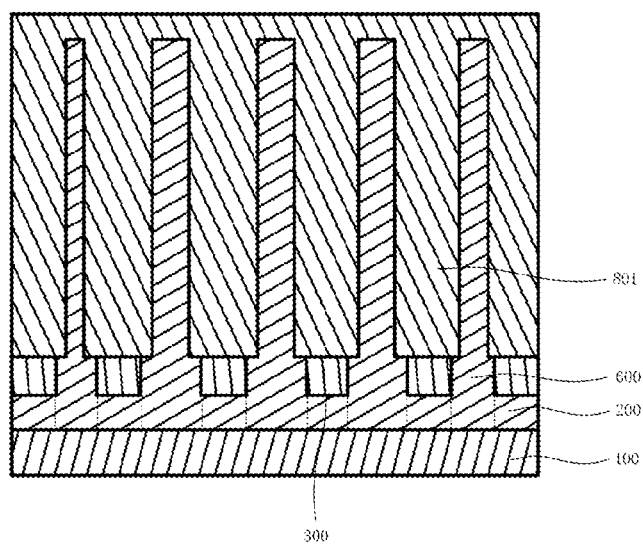
Figure 12C:
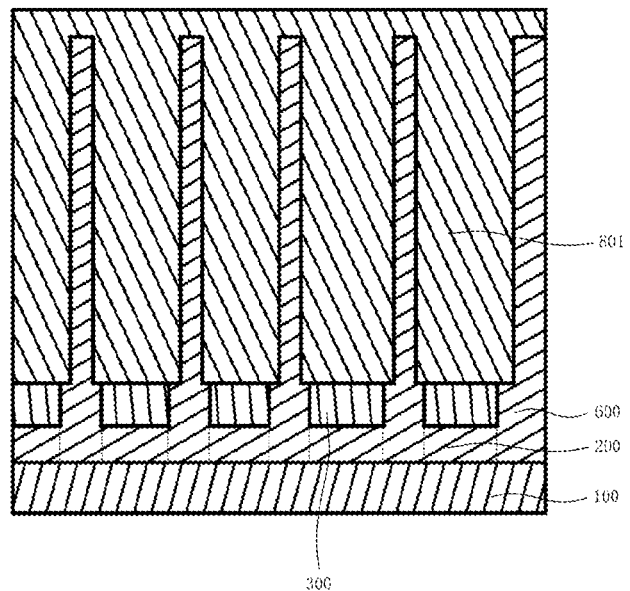

S91: depositing the first layer of polysilicon in each concave hole 701, the first layer of polysilicon being fully filled in the concave hole 701 and covering the separation layer 700 that remains. The structure formed by this step is as shown in FIGS. 12a, 12b and 12c, in which structure the first layer of polysilicon 801 is fully filled in the concave hole 701, and the first layer of polysilicon 801 covers the remaining separation layer 700; dotted lines in FIG. 12a are used to indicate positions of the bitline grooves 101 and positions of the concave holes 701, and dotted lines in FIGS. 12b and 12c are used to indicate that the first separation layer 200 and the third separation layer 600 are formed in different processing steps.

Figure 13A:
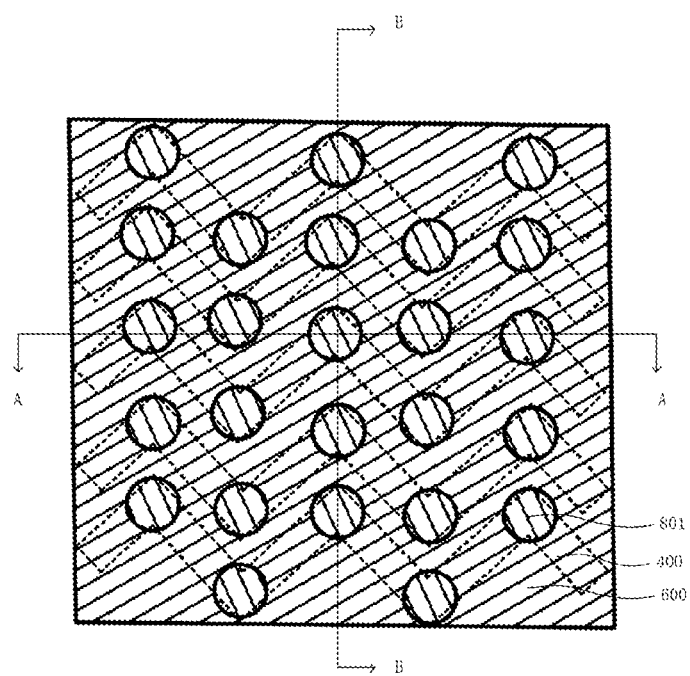
FIG. 13a is a diagram schematically illustrating the structure in which first layers of polysilicon are partially removed in an embodiment of the present application.
Figure 13B:
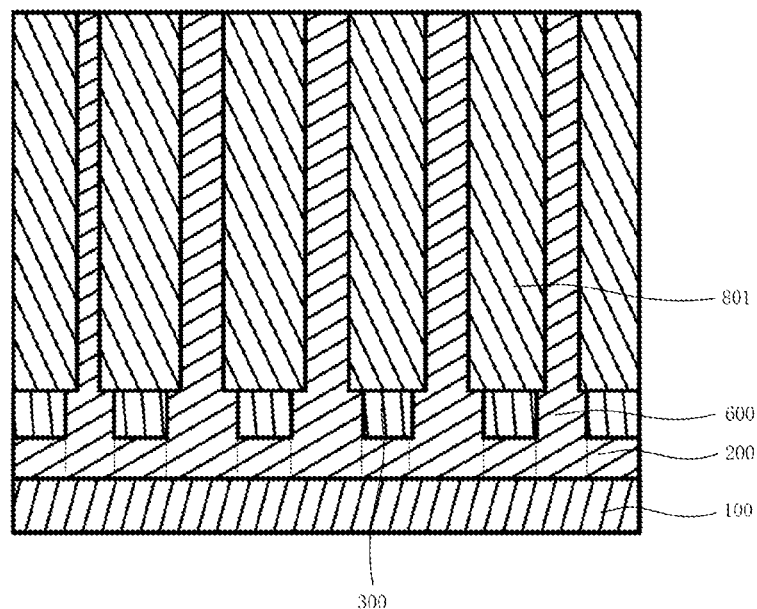
Figure 13C:
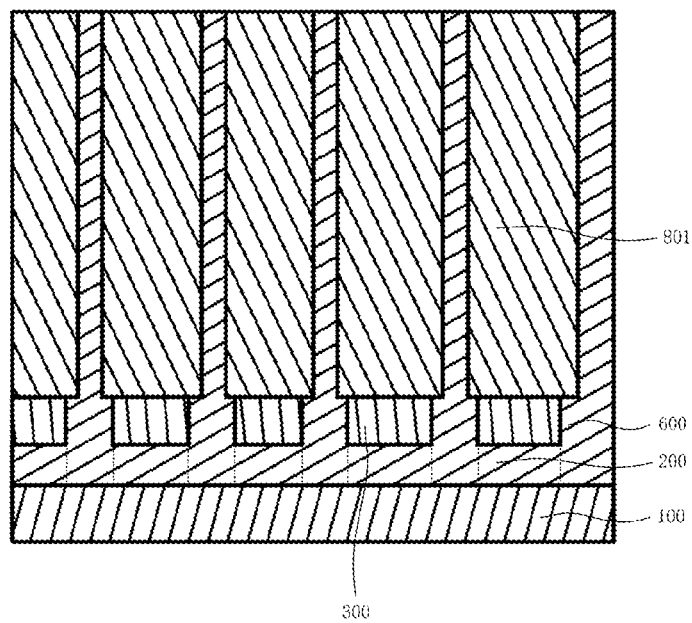

S92: removing part of the first layer of polysilicon 801, wherein the first layer of polysilicon 801 that remains is located in the concave hole 701, a top surface of the first layer of polysilicon 801 that remains is lower than a top surface of the separation layer 700, and the first layer of polysilicon 801 that remains in the concave hole 701 forms the bitline contact plunger 800. The structure formed by this step is as shown in FIGS. 14a, 14b and 14c, in which structure the first layer of polysilicon 801 is filled in the concave hole 701, the top surface of the first layer of polysilicon 801 is lower than the top surface of the third separation layer 600 and the top surface of the second separation layer 400, and the first layer of polysilicon 801 that remains in the concave hole 701 forms the bitline contact plunger 800. The structure formed by removing the first layer of polysilicon 801 from the top surfaces of the third separation layer 600 and the second separation layer 400 is as shown in FIGS. 13a, 13b and 13c, in which structure the first layer of polysilicon 801 is filled in the concave hole 701, and the top surface of the first layer of polysilicon 801 is flush with the top surface of the third separation layer 600 and the top surface of the second separation layer 400; dotted lines in FIG. 13a are used to indicate positions of the bitline grooves 101, and dotted lines in FIGS. 13b and 13c are used to indicate that the first separation layer 200 and the third separation layer 600 are formed in different processing steps; the structure formed by further removing part of the first layer of polysilicon 801 in the concave hole 701 is as shown in FIGS. 14a, 14b and 14c.

Referring further to FIG. 1, after forming the bitline contact plunger 800 in each concave hole 701, the method further comprises the following steps.

Figure 15A:
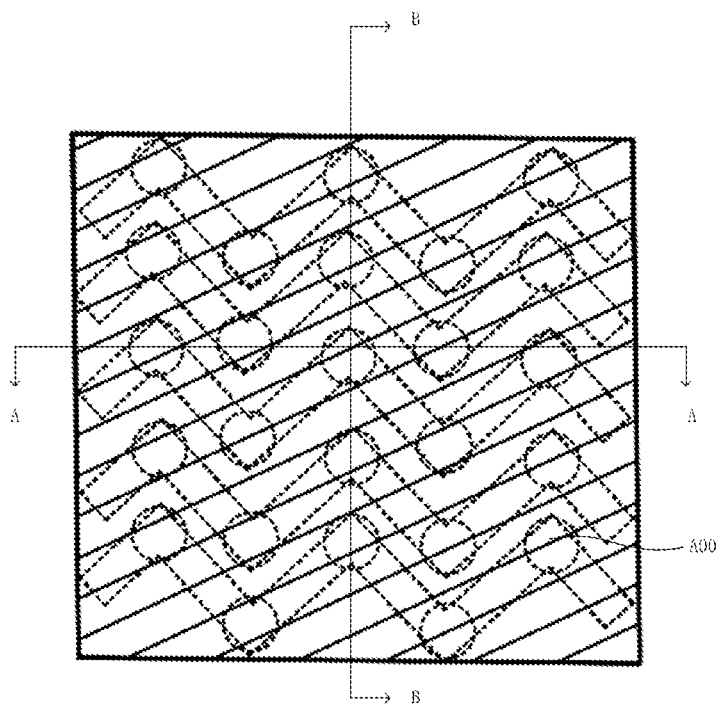
FIG. 15a is a diagram schematically illustrating the structure in which second layers of polysilicon are filled in concave holes and protective layers are disposed on second layers of polysilicon and remaining separation layers in an embodiment of the present application.
Figure 15B:
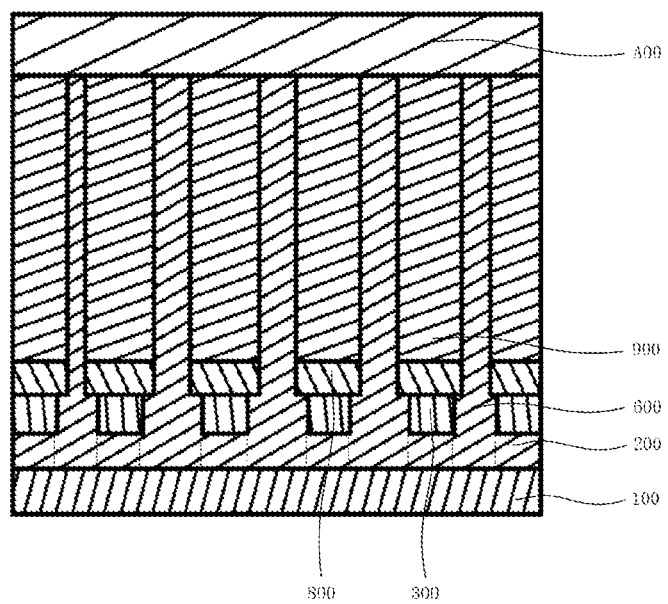
Figure 15C:
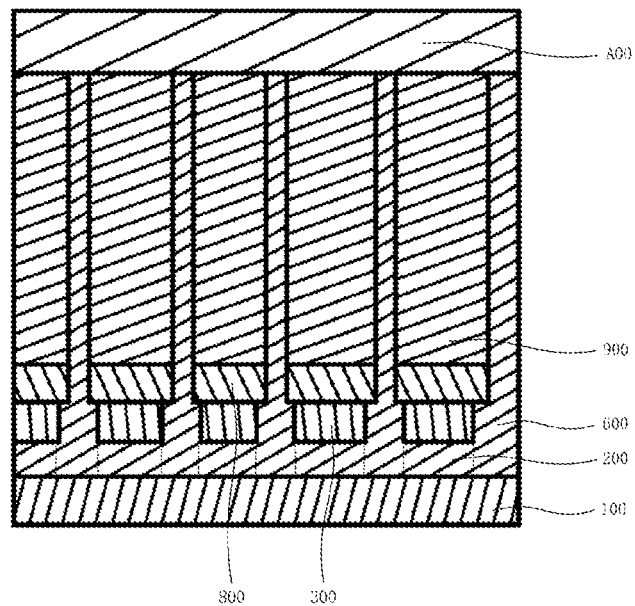

S0A: forming a second layer of polysilicon on the bitline contact plunger 800, a top surface of the second layer of polysilicon being flush with a top surface of the separation layer 700. The second layer of polysilicon can be formed by the process of deposition on the bitline contact plunger 800, and the structure formed by this step is as shown in FIGS. 15a, 15b and 15c, in which structure the bottom surface of the second layer of polysilicon 900 contacts the bitline contact plunger 800, and the top surface of the second layer of polysilicon 900 is flush with the top surface of the separation layer 700; dotted lines in FIG. 15a are used to indicate positions of the bitline grooves 101 and positions of the concave holes 701, and dotted lines in FIGS. 15b and 15c are used to indicate that the first separation layer 200 and the third separation layer 600 are formed in different processing steps.

S0B: forming a protective layer on the separation layer 700 that remains and the second layer of polysilicon 900. The material of the protective layer can be silicon nitride, and the protective layer can be formed also by the process of deposition on the remaining separation layer 700 and the second layer of polysilicon 900; the structure formed by this step is as shown in FIGS. 15a, 15b and 15c, in which structure the protective layer A00 is disposed on the second layer of polysilicon 900 and the remaining separation layer 700; in this step, the remaining separation layer 700 includes the third separation layer 600, the first separation layer 200 and part of the second separation layer 400.

Figure 16A:
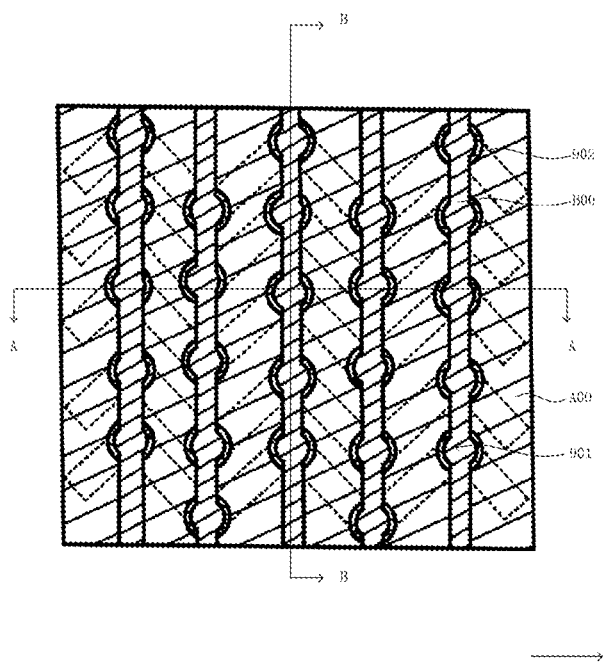
FIG. 16a is a diagram schematically illustrating the structure in which wordline grooves and node plunger slots are formed and first medium layers are formed in wordline grooves in an embodiment of the present application.

S0C: removing part of the protective layer A00, part of the second layer of polysilicon 900, and part of the separation layer 700 to form wordline grooves, wherein the wordline grooves are arranged along a fourth direction and extend along the first direction, the fourth direction, direction U as shown in FIG. 16a for example, is set perpendicular to the first direction, the second layer of polysilicon 900 that remains forms an active region located at both sides of the wordline grooves, in the protective layer A00 that remains are formed node plunger slots communicative with the wordline grooves, and widths of the node plunger slots are greater than widths of the wordline grooves. In the structure formed by this step, the wordline grooves 901 extend along the first direction and are arranged along the fourth direction, the width of the wordline groove 901 is smaller than the width of the second layer of polysilicon 900, the remaining second layer of polysilicon 900 is located at both sides of each wordline groove 901, the remaining second layer of polysilicon 900 constitutes the active region 902, the width of the wordline groove 901 is smaller than the width of the node plunger slot A01, and the node plunger slot A01 exposes the top surface of the active region 902.

The second layer of polysilicon 900 that remains in Step S0C should undergo ion implantation to form the active region 902, the implanted ions can be boron ions or phosphorus ions, and implantation of ions onto the second layer of polysilicon 900 enables the active region 902 thus formed to be provided with source/drain electrode(s).

Referring further to FIG. 1, after forming the wordline grooves 901, the method further comprises the following steps.

Figure 16B:
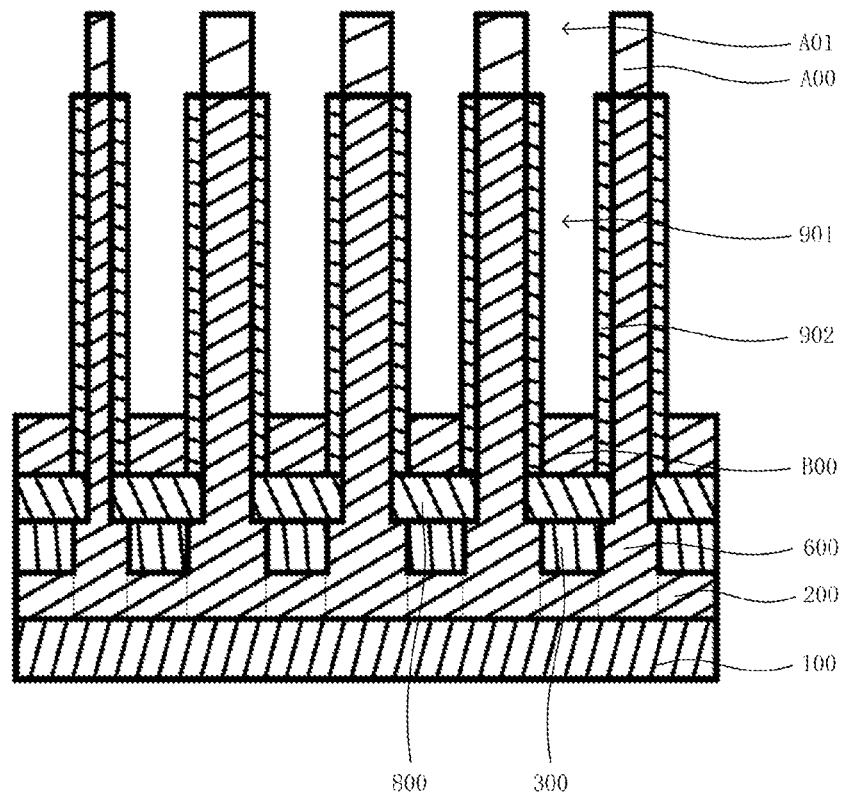
Figure 16C:
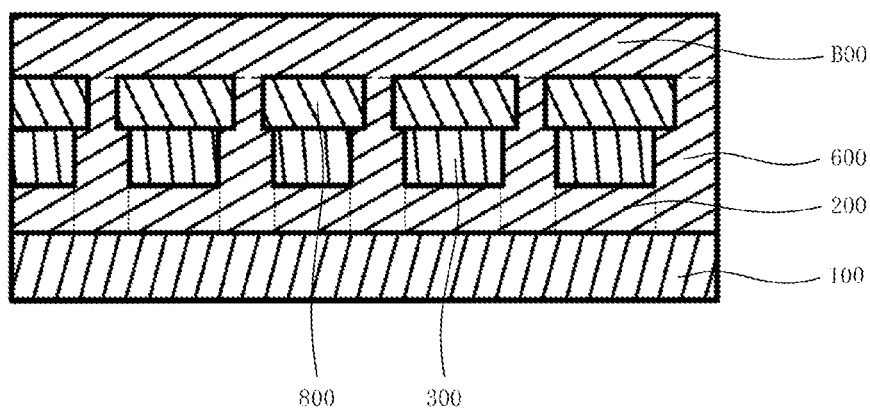

S0D: forming a first medium layer at a bottom of the wordline groove 901. The material of the first medium layer can be silicon dioxide, and the first medium layer can be formed also by the process of deposition at the bottom of the wordline groove 901. The structure formed by this step is as shown in FIGS. 16a, 16b and 16c, in which structure the first medium layer B00 is disposed in the wordline groove 901, the thickness of the first medium layer B00 is smaller than the depth of the wordline groove 901, and the top surface of the first medium layer B00 is lower than the groove notch of the wordline groove 901; dotted lines in FIG. 16a are used to indicate positions of the bitline grooves 101, and dotted lines in FIGS. 16b and 16c are used to indicate that the first separation layer 200, the third separation layer 600 and the first medium layer B00 are formed in different processing steps.

Figure 17A:
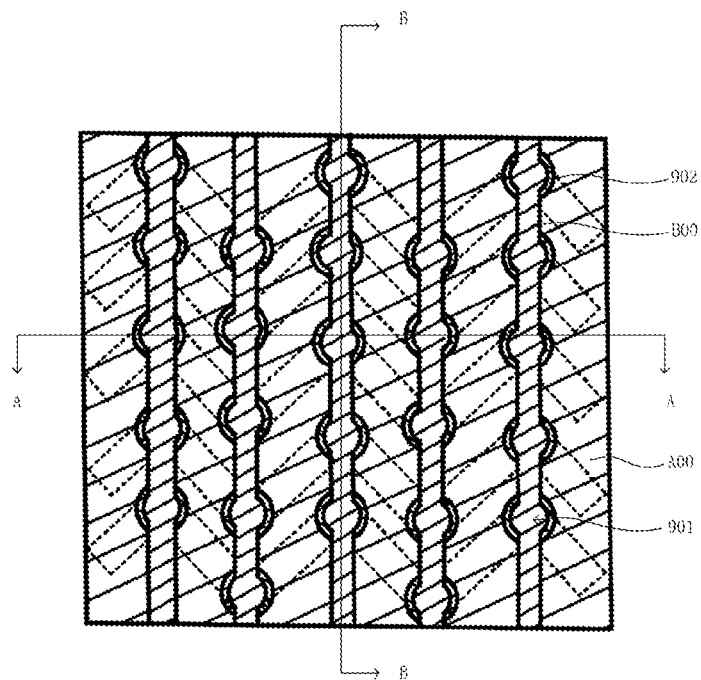
FIG. 17a is a diagram schematically illustrating the structure in which second medium layers are disposed in wordline grooves in an embodiment of the present application.
Figure 17B:
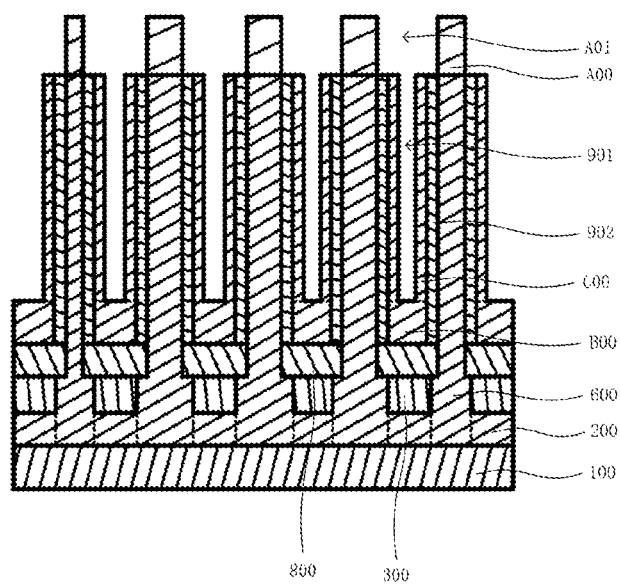
Figure 17C:
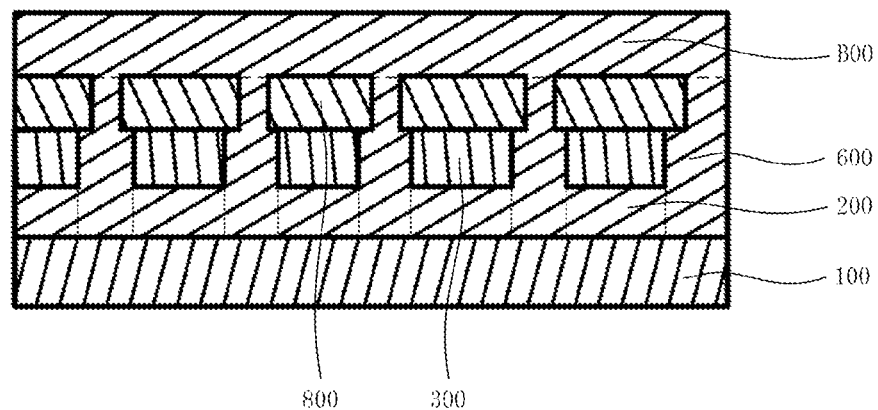

S0E: forming a second medium layer on the first medium layer B00, the second medium layer covering a sidewall of the active region 902. The material of the second medium layer can be silicon dioxide for example, the second medium layer can be produced by in-situ steam generation (ISSG), and the thickness of the second medium layer can be about 5 nm; the structure formed by this step is as shown in FIGS. 17a, 17b and 17c, in which structure the second medium layer C00 is disposed on the first medium layer B00, the second medium layer C00 covers the sidewall of the active region 902, and the thickness of the second medium layer C00 is less than half the groove width of the wordline groove 901; dotted lines in FIG. 17a are used to indicate positions of the bitline grooves 101, and dotted lines in FIGS. 17b and 17c are used to indicate that the first separation layer 200, the third separation layer 600, the first medium layer B00 and the second medium layer C00 are formed in different processing steps.

Figure 18A:
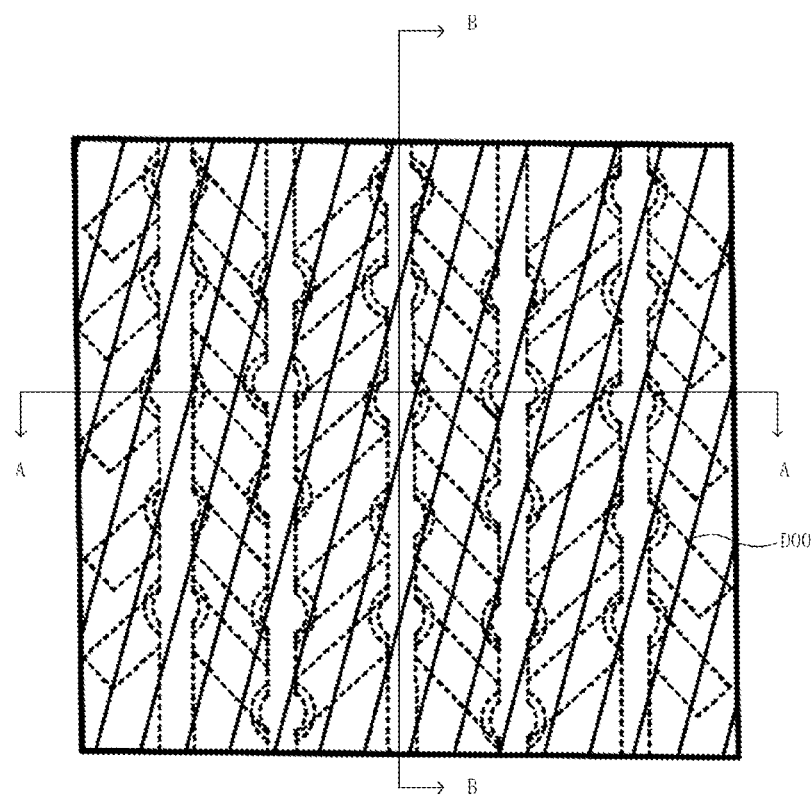
FIG. 18a is a diagram schematically illustrating the structure in which metal layers are disposed in wordline grooves in an embodiment of the present application.
Figure 18B:
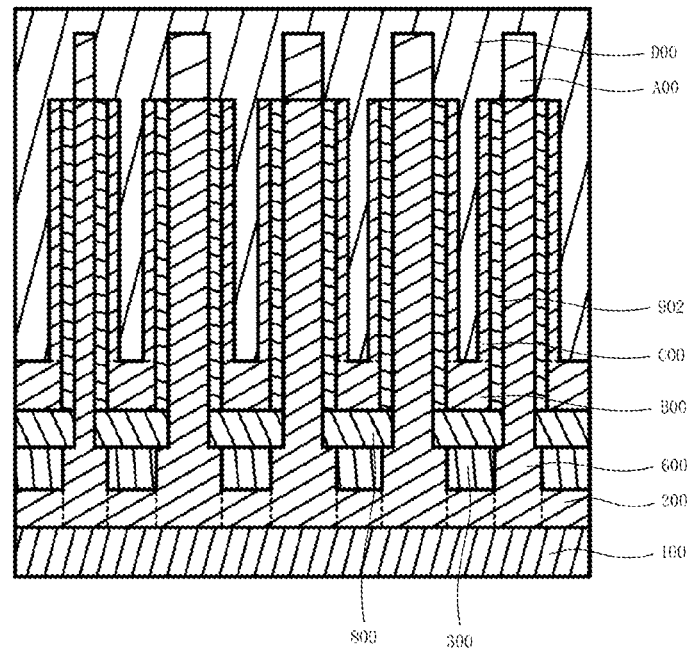
Figure 18C:
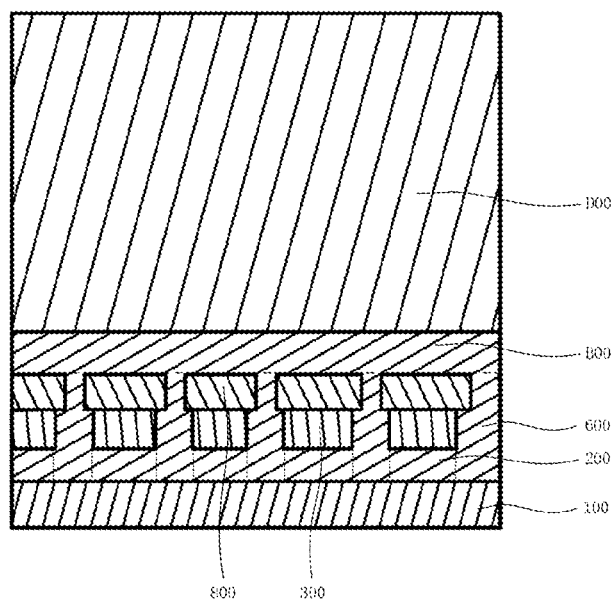

S0F: forming a metal layer on the first medium layer B00 and a lateral portion of the second medium layer C00 distal to the active region 902 in the wordline groove 901, wherein the metal layer is fully filled in the wordline groove 901 and the node plunger slot A01, and covers the separation layer 700 that remains and the protective layer A00 that remains. The material of the metal layer can be tungsten for example, and the metal layer can be disposed by the process of deposition, for instance, in the space formed by the first medium layer B00 and the second medium layer C00 in the wordline groove 901. The structure formed by this step is as shown in FIGS. 18a, 18b and 18c, in which structure the metal layer D00 is fully filled in the wordline groove 901 and the node plunger slot A01, and the metal layer D00 covers the remaining separation layer 700 and the remaining protective layer A00; dotted lines in FIG. 18a are used to indicate positions of the bitline grooves 101 and positions of the concave holes 701, and dotted lines in FIGS. 18b and 18c are used to indicate that the first separation layer 200, the third separation layer 600, the first medium layer B00 and the second medium layer C00 are formed in different processing steps.

Figure 19A:
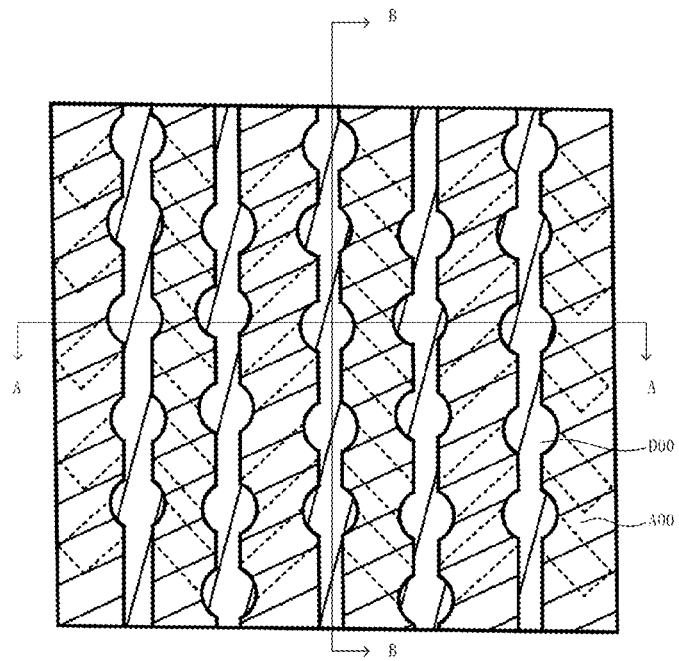
FIG. 19a is a diagram schematically illustrating the structure in which metal layers are removed from above top surfaces of protective layers in an embodiment of the present application.
Figure 19B:
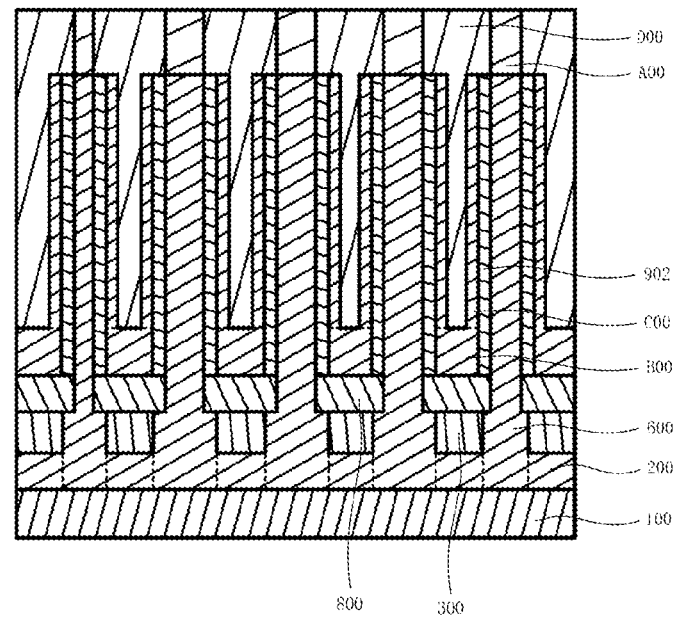
Figure 19C:
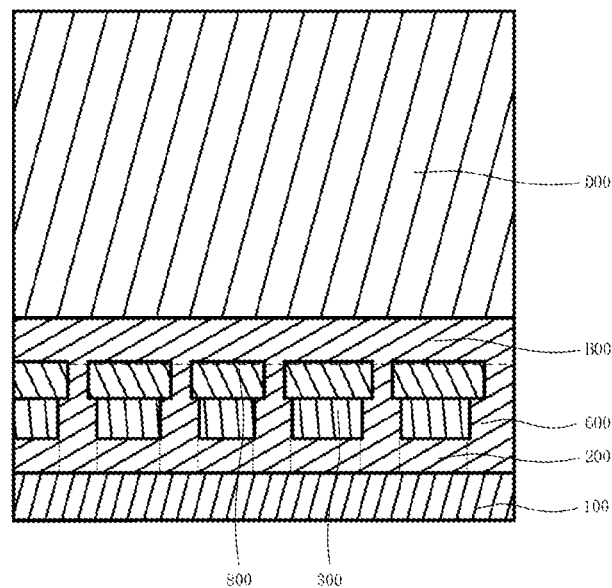
Figure 20A:
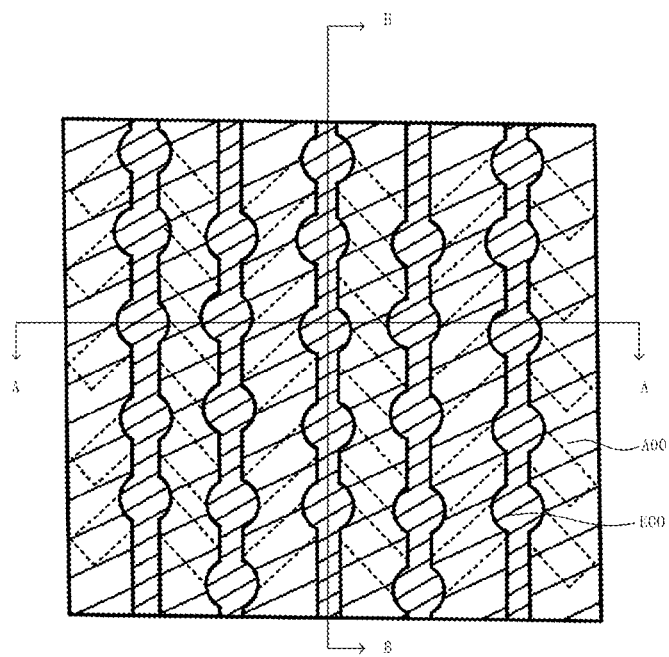
FIG. 20a is a diagram schematically illustrating the structure in which metal layers are partially removed from wordline grooves and third medium layers are disposed on metal layers in an embodiment of the present application.
Figure 20B:
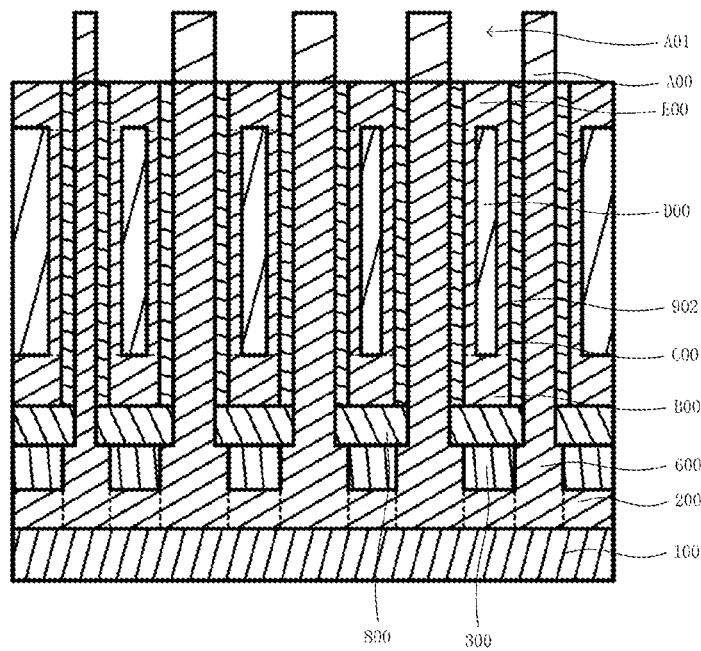
Figure 20C:
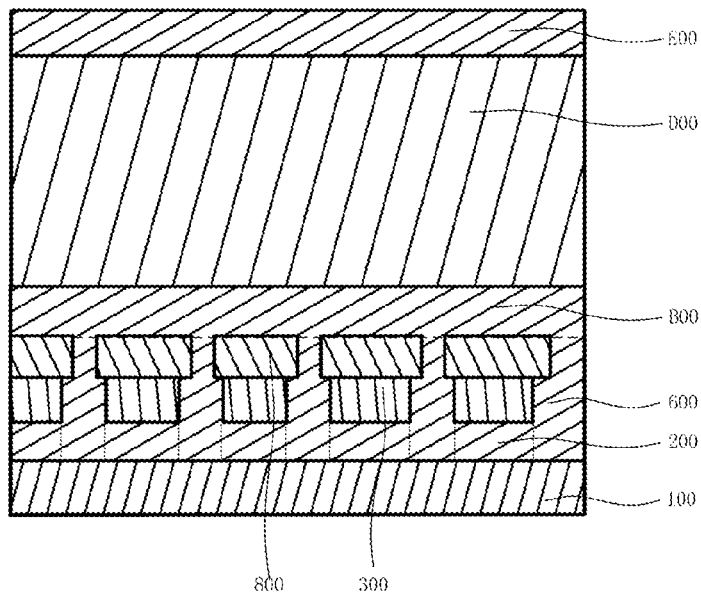

S0G: back-etching the metal layer D00 so that the top surface of the metal layer D00 is lower than the top surface of the active region 902. The metal layer D00 can be back-etched by the process of etching, and the structure formed by this step is as shown in FIGS. 20a, 20b and 20c, in which structure the metal layer D00 is disposed within a groove enclosed by the first medium layer B00 and the second medium layer C00 in the wordline groove 901, and the top surface of the metal layer D00 is lower than the top surface of the active region 902. During back-etching of the metal layer D00, when the top surface of the back-etched metal layer D00 is flush with the top surface of the protective layer A00, the structure thus formed is as shown in FIGS. 19a, 19b and 19c, in which structure the metal layer D00 is fully filled in the wordline groove 901 and the node plunger slot A01, and the top surface of the metal layer D00 is flush with the top surface of the protective layer A00; dotted lines in FIG. 19a are used to indicate positions of the bitline grooves 101, and dotted lines in FIGS. 19b and 19c are used to indicate that the first separation layer 200, the third separation layer 600, the first medium layer B00 and the second medium layer C00 are formed in different processing steps.

S0H: forming a third medium layer on the metal layer D00, a top surface of the third medium layer being flush with a bottom surface of the protective layer A00. The material of the third medium layer can be silicon dioxide for example, the third medium layer can be formed on the metal layer D00 by the process of deposition, for instance, and the structure formed by this step is as shown in FIGS. 20a, 20b and 20c, in which structure the bottom surface of the third medium layer E00 contacts the top surface of the metal layer D00, the top surface of the third medium layer E00 is flush with the active region 902, and the metal layer D00 forms a wordline; dotted lines in FIG. 20a are used to indicate positions of the bitline grooves 101, and dotted lines in FIGS. 20b and 20c are used to indicate that the first separation layer 200, the third separation layer 600, the first medium layer B00, the second medium layer C00 and the third medium layer E00 are formed in different processing steps.

Referring further to FIG. 1, after forming the third medium layer E00, the method further comprises the following steps.

S0I: forming a third layer of polysilicon on the third medium layer E00, the third layer of polysilicon being fully filled in the node plunger slot A01 and covering the protective layer A00. The third layer of polysilicon can be fully filled in the node plunger slot A01 by chemical vapor deposition (CVD) and covers the protective layer A00, and such ions as phosphorus ions or boron ions that change the electrical properties of the third layer of polysilicon are doped at the same time of depositing the third layer of polysilicon. In the structure formed by this step, the bottom surface of the third layer of polysilicon F00 contacts the top surface of the third medium layer E00 and the top surface of the active region 902, the third layer of polysilicon F00 is fully filled in the node plunger slot A01, and the top surface of the third layer of polysilicon F00 covers the top surface of the protective layer A00.

Figure 21A:
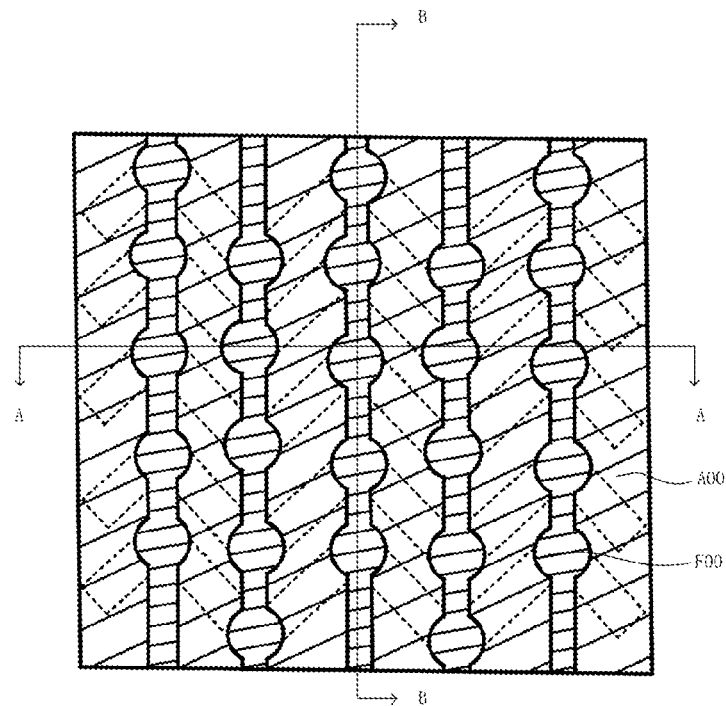
FIG. 21a is a diagram schematically illustrating the structure in which third layers of polysilicon are disposed in node plunger slots in an embodiment of the present application.
Figure 21B:
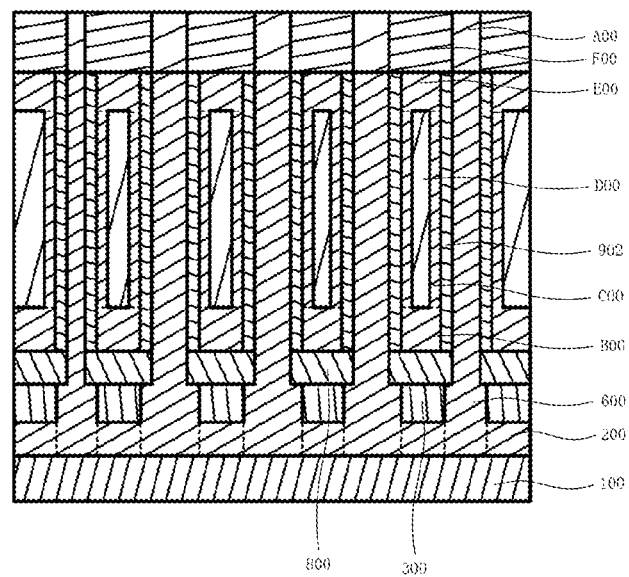
Figure 21C:
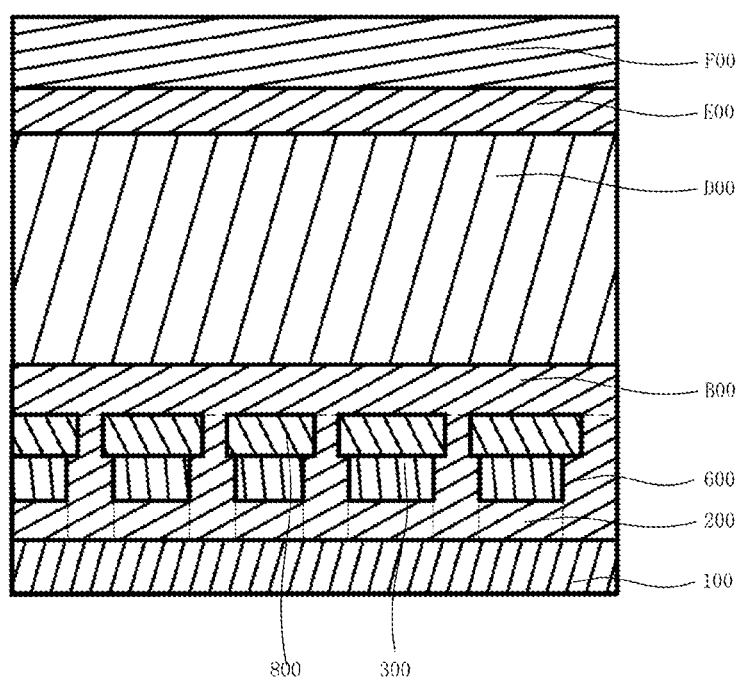

S0J: removing part of the third layer of polysilicon F00, wherein the third layer of polysilicon F00 that remains forms plural node contact plungers, each node contact plunger is electrically connected to a top end of the corresponding active region 902, and the node contact plungers and the bitline contact plungers 800 correspond to one another on a one-by-one basis on a direction perpendicular to the substrate 100. When part of the third layer of polysilicon F00 is removed, the third layer of polysilicon F00 above the top surface of the protective layer A00 is firstly removed, and the structure formed by this step is as shown in FIGS. 21a, 21b and 21c, in which structure the bottom surface of the third layer of polysilicon F00 contacts the top surface of the third medium layer E00 and the top surface of the active region 902, the third layer of polysilicon F00 is fully filled in the node plunger slot A01, and the top surface of the third layer of polysilicon F00 is flush with the top surface of the protective layer A00; dotted lines in FIG. 21a are used to indicate positions of the bitline grooves 101, and dotted lines in FIGS. 21b and 21c are used to indicate that the first separation layer 200, the third separation layer 600, the first medium layer B00, the second medium layer C00 and the third medium layer E00 are formed in different processing steps. Secondly, part of the third layer of polysilicon F00 in the node plunger slot A01 is removed; in the structure formed by this step, in each node plunger slot A01 are formed plural node contact plungers, each node contact plunger is electrically connected to the top end of the corresponding active region 902, and the node contact plungers and the bitline contact plungers 800 correspond to one another on a one-by-one basis on a direction perpendicular to the substrate 100.

The memory provided by an embodiment of the present application comprises a substrate 100, on which is disposed a separation layer 700, in which are arranged plural bitlines 300 spaced apart from one another, wherein the plural bitlines 300 are arranged along a first direction, each bitline 300 is S-shaped, and the first direction is for example direction X shown in FIG. 2a.

In the memory according to the embodiment of the present application, the separation layer 700 of the substrate 100 is provided therein with a plurality of bitlines 300 spaced apart from one another, the bitlines 300 are S-shaped and arranged along a first direction; on the substrate 100 of a unit size, with the increase in length of the bitlines 300 disposed in the separation layer 700, the number of bitline contact plungers 800 subsequently disposed to contact the bitlines 300 will be increased, the number of active regions 902 subsequently disposed to correspond to the bitline contact plungers 800 on a one-by-one basis will be increased, and the number of capacitors subsequently disposed to correspond to the active regions 902 on a one-by-one basis will also be increased, accordingly, the integration level of the memory will be higher.

Referring to FIG. 6a, each bitline 300 includes plural first bitline structures 302 and plural second bitline structures 303 spaced apart from one another and sequentially connected to one another, the first bitline structures 302 extend along a second direction, the second direction is inclined relative to the first direction, the second bitline structures 303 extend along a third direction, the third direction is inclined relative to the first direction, and the direction of inclination of the third direction relative to the first direction is opposite to the direction of inclination of the second direction relative to the first direction. In the embodiment shown in FIG. 6a, each bitline 300 includes three first bitline structures 302 and three second bitline structures 303, the three first bitline structures 302 and the three second bitline structures 303 are spaced apart from one another and sequentially connected to one another, the first bitline structures 302 extend along a second direction, which is for example direction Y shown in FIG. 6a, the second bitline structures 303 extend along a third direction, which is for example direction Z shown in FIG. 6a, and directions Y and Z are opposite in direction of inclination relative to direction X shown in FIG. 2a.

Referring to FIGS. 6a, 8b, 14a, 14b and 14c, on each bitline 300 are disposed plural bitline contact plungers 800 spaced apart from one another, the bitline contact plungers 800 are disposed in the separation layer 700, and each bitline contact plunger 800 is disposed at a position connecting a corresponding first bitline structure 302 and a corresponding second bitline structure 303. In the embodiments shown in FIGS. 6a and 14a, above each bitline 300 are disposed five bitline contact plungers 800, and each bitline contact plunger 800 is disposed at a conjunction of a first bitline structure 302 and a second bitline structure 303 connected to each other.

Referring to FIGS. 8b, 16a, 16b and 16c, on each bitline contact plunger 800 is disposed an active region 902, and the active region 902 is disposed in the separation layer 700. In the embodiments shown in FIGS. 8b and 16b, the active region 902 is disposed in the separation layer 700, the active region 902 is connected with the bitline 300 through the bitline contact plunger 800, the bottom surface of the active region 902 contacts the top surface of the bitline contact plunger 800, and the bottom surface of the bitline contact plunger 800 contacts the top surface of the bitline 300.

In the separation layer 700 are further disposed plural wordlines arranged along a fourth direction and extending along a first direction, the fourth direction is set perpendicular to the first direction, and the fourth direction is for example direction U shown in FIG. 16a.

Each wordline includes plural gate electrodes and plural wordline structures, each gate electrode is correspondingly disposed in one active region 902, the plural gate electrodes included in each wordline are correspondingly disposed in the active regions 902 of the same column, the active regions 902 of the same column are arranged along the first direction, the plural gate electrodes and the plural wordline structures are spaced apart on a one-by-one basis, each wordline structure is disposed in the separation layer 700, and each wordline structure is employed to connect two adjacent gate electrodes. In the embodiment shown in FIGS. 20a, 20b and 20c, each wordline includes five gate electrodes and five wordline structures, the gate electrodes are formed at least by metal layers D00 disposed in the active regions 902, the wordline structures are formed at least by metal layers D00 disposed in the separation layers 700, and the five gate electrodes and five wordline structures are spaced apart.

Referring to FIGS. 20a, 20b and 20c, the wordline includes a metal layer D00 and a medium layer, the medium layer includes a first medium layer B00, a second medium layer C00, and a third medium layer E00, the first medium layer B00 is disposed on the bitline contact plunger 800 and the separation layer 700, the metal layer D00 and the second medium layer C00 are disposed on the top surface of the first medium layer B00, the top surface of the metal layer D00 is flush with the top surface of the second medium layer C00, the second medium layer C00 is disposed at two opposite sides of the metal layer D00, and the third medium layer E00 is disposed at the top surface of the metal layer D00 and the top surface of the second medium layer C00.

On each wordline are disposed plural node contact plungers spaced apart from one another, each node contact plunger is electrically connected to a top end of an active region 902, and the node contact plungers and the bitline contact plungers 800 correspond to one another on a one-by-one basis on a direction perpendicular to the substrate 100.

The various examples or embodiments in the Description are progressively described, emphasis on each example is put on its difference from other examples, while identical or similar portions of various examples can be mutually referred.

In the description in this application, such reference terms as "one embodiment", "some embodiments", "exemplary embodiment", "example", "specific example", and "some examples" are meant to denote that specific features, structures, materials or characteristics described in combination with the embodiments or examples are included in at least one embodiment or example of the present application. In the current Description, the denotative expression of the foregoing terms is not necessarily meant for the same embodiments or examples. Moreover, the specific features, structures, materials or characteristics as described can be suitably combined in any one or more embodiment(s) or example(s).

As should be finally noted, the aforementioned embodiments are merely directed to describe the technical solutions of the present application, rather than to restrict the present application. Although the present application is described in detail with reference to the aforementioned embodiments, it should be understood by persons ordinarily skilled in the art that they could still make amendment to the technical solutions recorded in the aforementioned embodiments, or make equivalent substitution on partial or entire technical features therein; all such amendments or substitutions do not essentially separate the corresponding technical solutions from the scope of the technical solutions in the embodiments of the present application.

What is claimed is:

1. A memory, comprising a substrate, on which is disposed a separation layer, in which are arranged plural bitlines spaced apart from one another, wherein the plural bitlines are arranged along a first direction, and each bitline is S-shaped, wherein
    each bitline includes plural first bitline structures and plural second bitline structures spaced apart from one another and sequentially connected to one another, the first bitline structures extend along a second direction, the second direction is inclined relative to the first direction, the second bitline structures extend along a third direction, the third direction is inclined relative to the first direction, and a direction of inclination of the third direction relative to the first direction is opposite to a direction of inclination of the second direction relative to the first direction.

2. The memory according to claim 1, wherein on each bitline are arranged plural bitline contact plungers spaced apart from one another, the bitline contact plungers are disposed in the separation layer, and each bitline contact plunger is located at a position connecting a corresponding first bitline structure and a corresponding second bitline structure.

3. The memory according to claim 2, wherein on each bitline contact plunger is disposed an active region, and the active region is disposed in the separation layer.

4. The memory according to claim 3, wherein in the separation layer are further disposed plural wordlines, the plural wordlines are arranged along a fourth direction, each wordline extends along the first direction, and the fourth direction is set perpendicular to the first direction.

5. The memory according to claim 4, wherein each wordline includes plural gate electrodes and plural wordline structures, each gate electrode is correspondingly disposed in one active region, the plural gate electrodes included in each wordline are correspondingly disposed in the active regions of the same column, the active regions of the same column are arranged along the first direction, the plural gate electrodes and the plural wordline structures are spaced apart on a one-by-one basis, each wordline structure is disposed in the separation layer, and each wordline structure is employed to connect two adjacent gate electrodes.

6. The memory according to claim 4, wherein the wordline includes a metal layer and a medium layer, the medium layer includes a first medium layer, a second medium layer, and a third medium layer, the metal layer and the second medium layer are disposed at a top surface of the first medium layer, the second medium layer is disposed at two opposite sides of the metal layer, and the third medium layer is disposed at a top surface of the metal layer and a top surface of the second medium layer.

7. The memory according to claim 5, wherein the wordline includes a metal layer and a medium layer, the medium layer includes a first medium layer, a second medium layer, and a third medium layer, the metal layer and the second medium layer are disposed at a top surface of the first medium layer, the second medium layer is disposed at two opposite sides of the metal layer, and the third medium layer is disposed at a top surface of the metal layer and a top surface of the second medium layer.

8. The memory according to claim 4, wherein on each wordline are disposed plural node contact plungers spaced apart from one another, each node contact plunger is electrically connected to a top end of the active region, and the node contact plungers and the bitline contact plungers correspond to one another on a one-by-one basis on a direction perpendicular to the substrate.

9. The memory according to claim 5, wherein on each wordline are disposed plural node contact plungers spaced apart from one another, each node contact plunger is electrically connected to a top end of the active region, and the node contact plungers and the bitline contact plungers correspond to one another on a one-by-one basis on a direction perpendicular to the substrate.

10. A method of fabricating a memory, comprising:
    providing a substrate;
    forming on the substrate plural bitline grooves that are arranged along a first direction and each of which is S-shaped;
    forming in each bitline groove a first separation layer whose thickness is smaller than depth of the bitline groove;
    forming bitlines on the first separation layer, wherein total thickness of the first, separation layer and the bitlines is smaller than depth of the bitline groove, the plural bitlines are arranged along the first direction, and each bitline is S-shaped;
    forming a second separation layer on the bitline, a top surface of the second separation layer being flush with a top surface of the substrate;

removing the substrate between adjacent separation walls, and retaining the substrate under a bottom surface of the first separation layer, wherein the separation wall includes the first separation layer, the bitlines, and the second separation layer; and thrilling a third separation layer in a space between the adjacent separation walls, the third separation layer, the second separation layer, and the first separation layer together forming a separation layer, wherein in the step of forming bitlines on the first separation layer:

each bitline as formed includes plural first bitline structures and plural second bitline structures spaced apart from one another and sequentially connected to one another, the first bitline structures extend along a second direction, the second direction is inclined relative to the first direction, the second bitline structures extend along a third direction, the third direction is inclined relative to the first direction, and a direction of inclination of the third direction relative to the first direction is opposite to a direction of inclination of the second direction relative to the first direction.

11. The method of fabricating a memory according to claim 10, wherein, after forming the third separation layer, the method further comprises:

removing part of the separation layer at a position connecting the first bitline structure and the second bitline structure to form plural concave holes, each concave hole exposing the bitline, and depositing, a first layer of polysilicon in each concave hole to form a bitline contact plunger.

12. The method of fabricating a memory according to claim 11, wherein the step of depositing a first layer of polysilicon in each concave hole to form a bitline contact plunger includes:

depositing the first layer of polysilicon in each concave hole, the first layer of polysilicon being fully filled in the concave hole and covering the separation layer that remains; and removing part of the first layer of polysilicon, wherein the first layer of polysilicon that remains is located in the concave hole, a top surface of the first layer of polysilicon that remains is lower than a top surface of the separation layer, and the first layer of polysilicon that remains in the concave hole forms the bitline contact plunger.

13. The method of fabricating a memory according to claim 11, wherein, after forming the bitline contact plunger in each concave hole, the method further comprises:

forming a second layer of polysilicon on the bitline contact plunger, a top surface of the second layer of polysilicon being flush with a top surface of the separation layer;

forming a protective layer on the separation layer that remains and the second layer of polysilicon; and removing part of the protective layer, part of the second layer of polysilicon, and part of the separation layer to form wordline grooves, wherein the wordline grooves are arranged along a fourth direction and extend along the first direction, the fourth direction is set perpendicular to the first direction, the second layer of polysilicon that remains forms an active region located at both sides of the wordline grooves, in the protective layer that remains are formed node plunger slots communicative with the wordline grooves, and widths of the node plunger slots are greater than widths of the wordline grooves.

14. The method of fabricating a memory according to claim 13, wherein the second layer of polysilicon that remains forms the active region after ion implantation.

15. The method of fabricating a memory according to claim 13, wherein, after forming the wordline grooves, the method further comprises:

forming a first medium layer at a bottom of the wordline groove;

forming a second medium layer on the first medium layer, the second medium layer covering a sidewall of the active region;

forming a metal layer on the first medium layer and a lateral portion of the second medium layer distal to the active region in the wordline groove, wherein the metal layer is fully filled in the wordline groove and the node plunger slot, and covers the separation layer that remains and the protective layer that remains;

back-etching the metal layer so that the metal layer is lower than the active region; and forming a third medium layer on the metal layer, a top surface of the third medium layer being flush with a bottom surface of the protective layer.

16. The method of fabricating; a memory according to claim 15, wherein, after forming the third medium layer, the method further comprises:

forming a third layer of polysilicon on the third medium layer, the third layer of polysilicon being, fully filled in the node plunger slot and covering the protective layer; and removing part of the third layer of polysilicon, wherein the third layer of polysilicon that remains forms plural node contact plungers, each node contact plunger is electrically connected to a top end of the corresponding active region, and the node contact plungers and the bitline contact plungers correspond to one another on a one-by-one basis on a direction perpendicular to the substrate.

17. The method of fabricating a memory according to claim 12, wherein, after forming the bitline contact plunger in each concave bole, the method further comprises:

forming a second layer of polysilicon on the bitline contact plunger, a top surface of the second layer of polysilicon being flush with a top surface of the separation layer;

forming a protective layer on the separation layer that remains and the second layer of polysilicon; and removing part of the protective laver, part of the second layer of polysilicon, and part of the separation layer to form wordline grooves, wherein the wordline grooves are arranged along a fourth direction and extend along the first direction, the fourth direction is set perpendicular to the first direction, the second layer of polysilicon that remains forms an active region located at both sides of the wordline grooves, in the protective layer that remains are formed node plunger slots communicative with the wordline grooves, and widths of the node plunger slots are greater than widths of the wordline grooves.

* * * * *